United States Patent
Cheng et al.

(10) Patent No.: US 12,096,543 B2
(45) Date of Patent: *Sep. 17, 2024

(54) METHOD FOR USING RADIATION SOURCE APPARATUS

(71) Applicant: TAIWAN SEMICONDUCTOR MANUFACTURING COMPANY, LTD., Hsinchu (TW)

(72) Inventors: Chiao-Hua Cheng, Tainan (TW); Hsin-Feng Chen, Yilan (TW); Yu-Fa Lo, Kaohsiung (TW); Yu-Kuang Sun, Hsinchu (TW); Wei-Shin Cheng, Hsinchu (TW); Yu-Huan Chen, Hsinchu (TW); Ming-Hsun Tsai, Hsinchu (TW); Cheng-Hao Lai, Taichung (TW); Cheng-Hsuan Wu, New Taipei (TW); Shang-Chieh Chien, New Taipei (TW); Heng-Hsin Liu, New Taipei (TW); Li-Jui Chen, Hsinchu (TW); Sheng-Kang Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,930

(22) Filed: Jan. 9, 2023

(65) Prior Publication Data

US 2023/0164901 A1    May 25, 2023

Related U.S. Application Data

(63) Continuation of application No. 17/369,740, filed on Jul. 7, 2021, now Pat. No. 11,553,581.

(60) Provisional application No. 63/163,433, filed on Mar. 19, 2021.

(51) Int. Cl.
    *H05G 2/00*    (2006.01)
    *G03F 7/00*    (2006.01)

(52) U.S. Cl.
    CPC ........ *H05G 2/006* (2013.01); *G03F 7/70033* (2013.01); *G03F 7/7055* (2013.01); *H05G 2/008* (2013.01)

(58) Field of Classification Search
    CPC .... H05G 2/006; H05G 2/008; G03F 7/70033; G03F 7/7055
    See application file for complete search history.

(56) References Cited

U.S. PATENT DOCUMENTS

| | | | |
|---|---|---|---|
| 11,553,581 B2* | 1/2023 | Cheng | G03F 7/70175 |
| 2008/0067456 A1 | 3/2008 | Kloepfel | |

* cited by examiner

*Primary Examiner* — Nicole M Ippolito
*Assistant Examiner* — Hanway Chang
(74) *Attorney, Agent, or Firm* — Maschoff Brennan

(57) ABSTRACT

A method for using an extreme ultraviolet radiation source is provided. The method includes performing a lithography process using an extreme ultraviolet (EUV) radiation source; after the lithography processes, inserting an extraction tube into a vessel of the EUV radiation source; and cleaning a collector of the EUV radiation source by using the extraction tube.

20 Claims, 20 Drawing Sheets

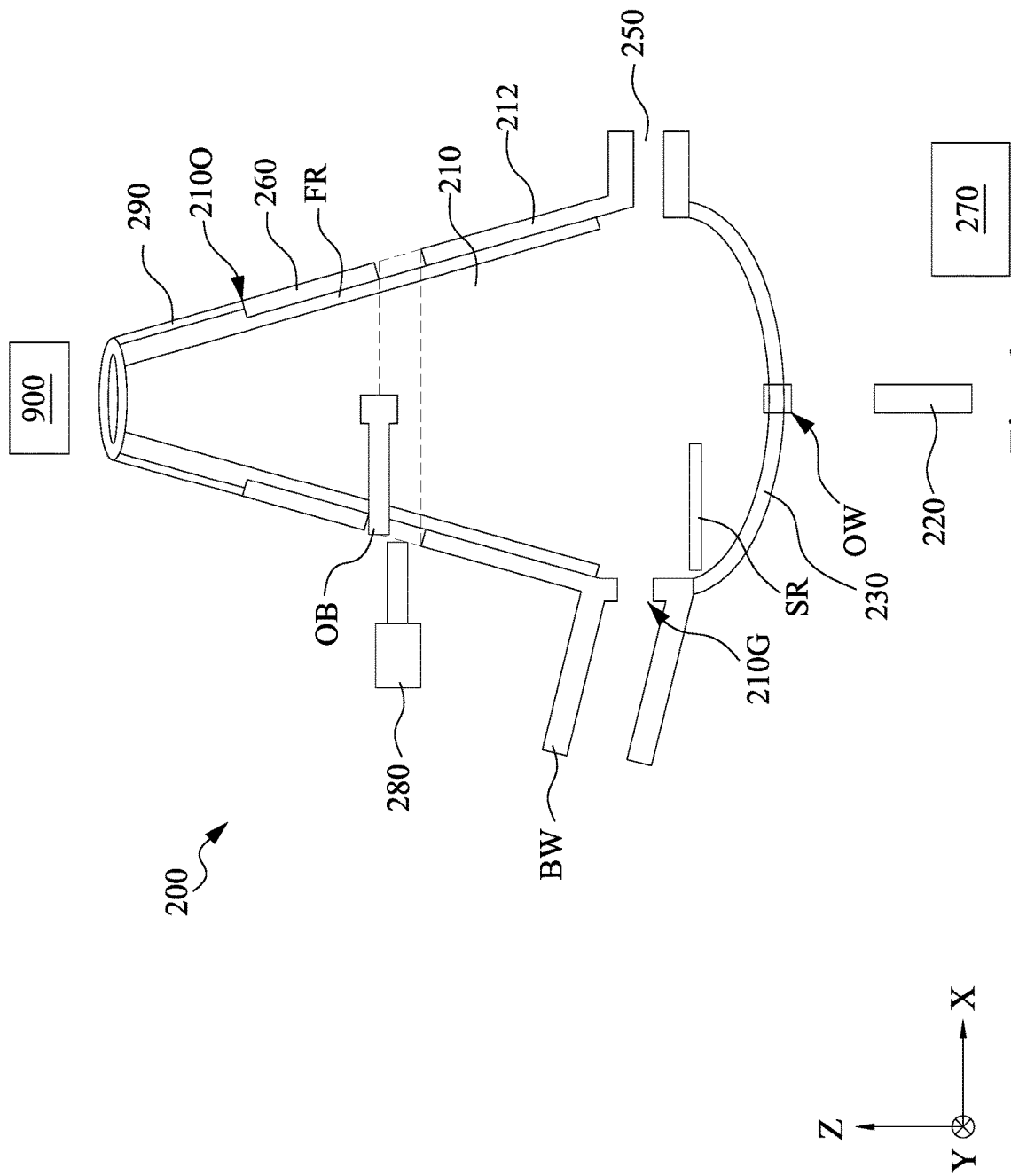

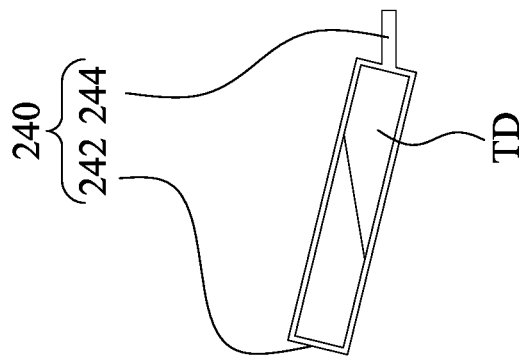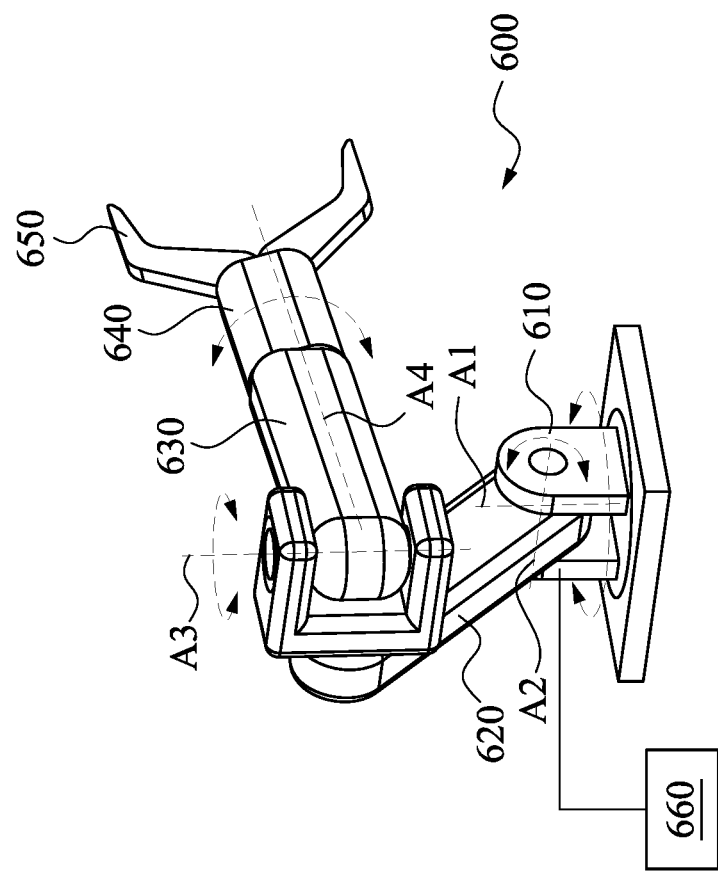
Fig. 15

METHOD FOR USING RADIATION SOURCE APPARATUS

PRIORITY CLAIM AND CROSS-REFERENCE

This application is a continuation of U.S. patent application Ser. No. 17/369,740, filed Jul. 7, 2021, now U.S. Pat. No. 11,553,581, issued on Jan. 10, 2023, which claims priority to U.S. Provisional Application Ser. No. 63/163,433, filed Mar. 19, 2021, the entirety of which is incorporated by reference herein in their entireties.

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light, is a promising next-generation lithography solution for emerging technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 4, 5A-5B, 6, and 7 illustrates a method for using an EUV radiation source at different stages according to some embodiments of the present disclosure.

FIG. 15 is a schematic view of robot arms used to move a droplet generator and move a cleaning device according to some embodiments of the present disclosure.

DETAILED DESCRIPTION

Figure 1A:
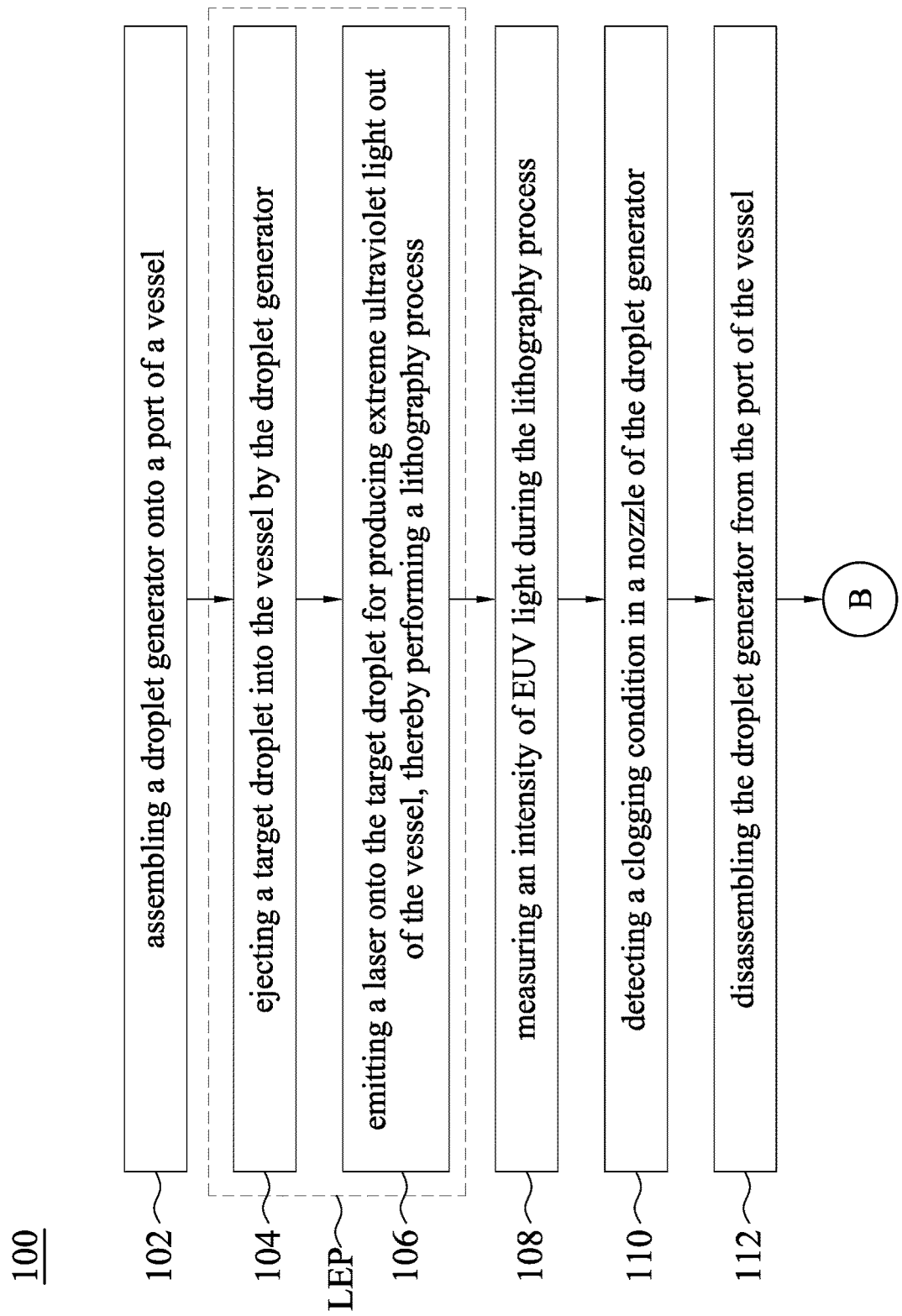
FIGS. 1A and 1B are flow charts of a method for using an EUV radiation source according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An extreme ultraviolet (EUV) photolithography system uses extreme ultraviolet radiation. One method of producing the extreme ultraviolet radiation is to emit a laser to droplets of tin. As the tin droplets are produced into the EUV radiation source vessel, the laser hits the tin droplets and heats the tin droplets to a critical temperature that causes atoms of tin to shed their electrons and become a plasma of ionized tin droplets. The ionized tin droplets emit photons, which is collected by a collector and provided as EUV radiation to an optical lithography system. The collector is designed with suitable coating material and shape, functioning as a mirror for EUV collection, reflection, and focus.

In some embodiments, the plasma of ionized tin droplets may cool down and become liquids and small particles, which are respectively referred to as drips and drops, and may be collectively referred to as debris. The debris may deposit onto a surface of the collector, thereby causing contamination thereon. Over time, the reflectivity of the collector degrades due to debris accumulation and other factors such as ion damages, oxidation, and blistering. In some cases, in order to keep EUV radiation power and productivity, the collector is moved out for cleaning tin contaminant, which may take lots of time. In some embodiments of the present disclosure, an in-line cleaning process is performed for cleaning the surface of the collector without moving the collector, thereby prolonging the lifetime of the collector and gains lots of tool time for productivity.

Figure 1B:
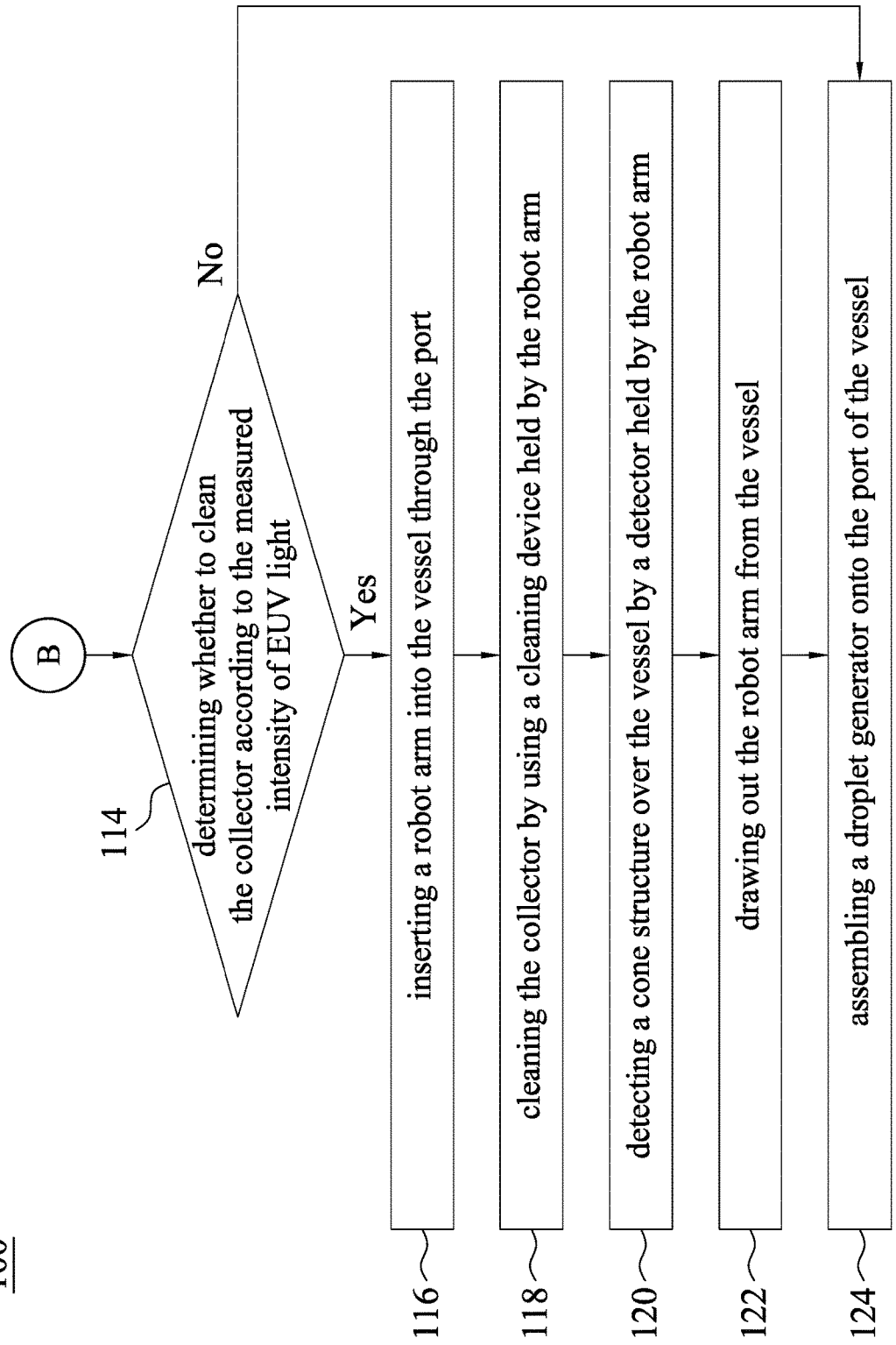

FIGS. 1A and 1B are flow charts of a method 100 for using an EUV radiation source according to some embodiments of the present disclosure. The method 100 may include steps 102-118. At step 102, a droplet generator is assembled onto a port of a vessel. Subsequently, a lithography exposure process LEP including steps 104 and 106 is performed. For example, at step 104, the droplet generator ejects a target droplet (e.g., tin droplet) into the vessel. At step 106, a laser is emitted onto the target droplet for producing extreme ultraviolet (EUV) light out of the vessel. At step 108, an intensity of EUV light is measured. At step 110, a clogging condition of a nozzle in the droplet generator is detected. At step 112, the droplet generator is disassembled from port of a vessel. At step 114, a determination whether to clean the collector is made according to the measured intensity of EUV light. At step 116, if the determination determines that the collector requires cleaning, a robot arm is inserted into the vessel through the port. At step 116, the collector is cleaned by using a cleaning device held by the robot arm. At step 118, a cone structure over the vessel is detected by a detector held by the robot arm. At step 120, the robot arm is moved away from the vessel. At step 122, a droplet generator is assembled onto the port. It is understood that additional steps may be provided before, during, and after the steps 102-124 shown by FIGS. 1A and 1B, and some of the steps described below can be replaced or eliminated for additional embodiments of the method. The order of the operations/processes may be interchangeable.

Figure 2:
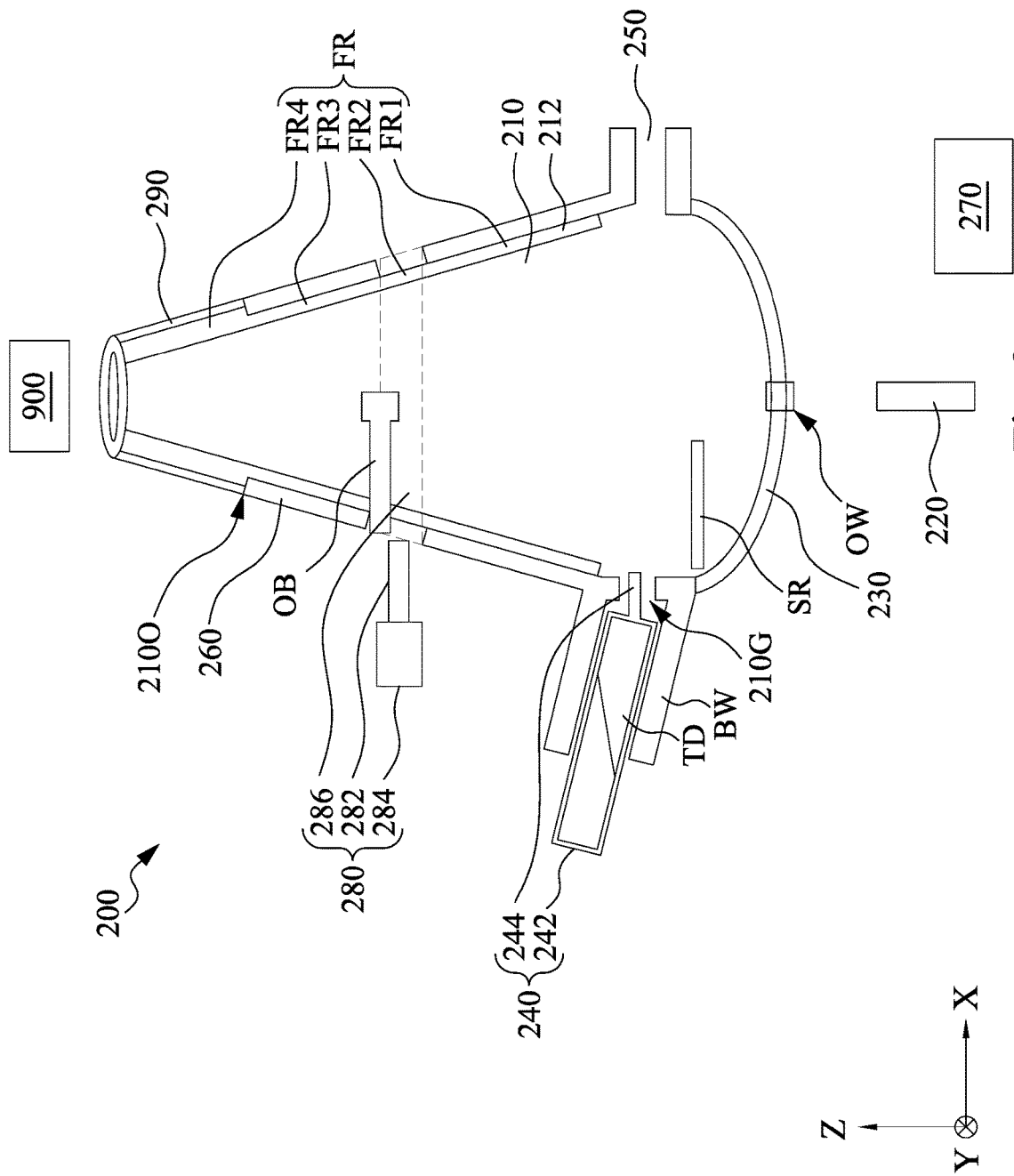

FIGS. 2, 3A, 4, 5A-5C, and 6 illustrates a method 100 for using an EUV radiation source 200 at different stages according to some embodiments of the present disclosure. Referring to FIGS. 1A and 2, the method 100 begins at step 102 where the droplet generator 240 is assembled onto the port 210G of a vessel 210 of the EUV radiation source 200.

Figure 16:
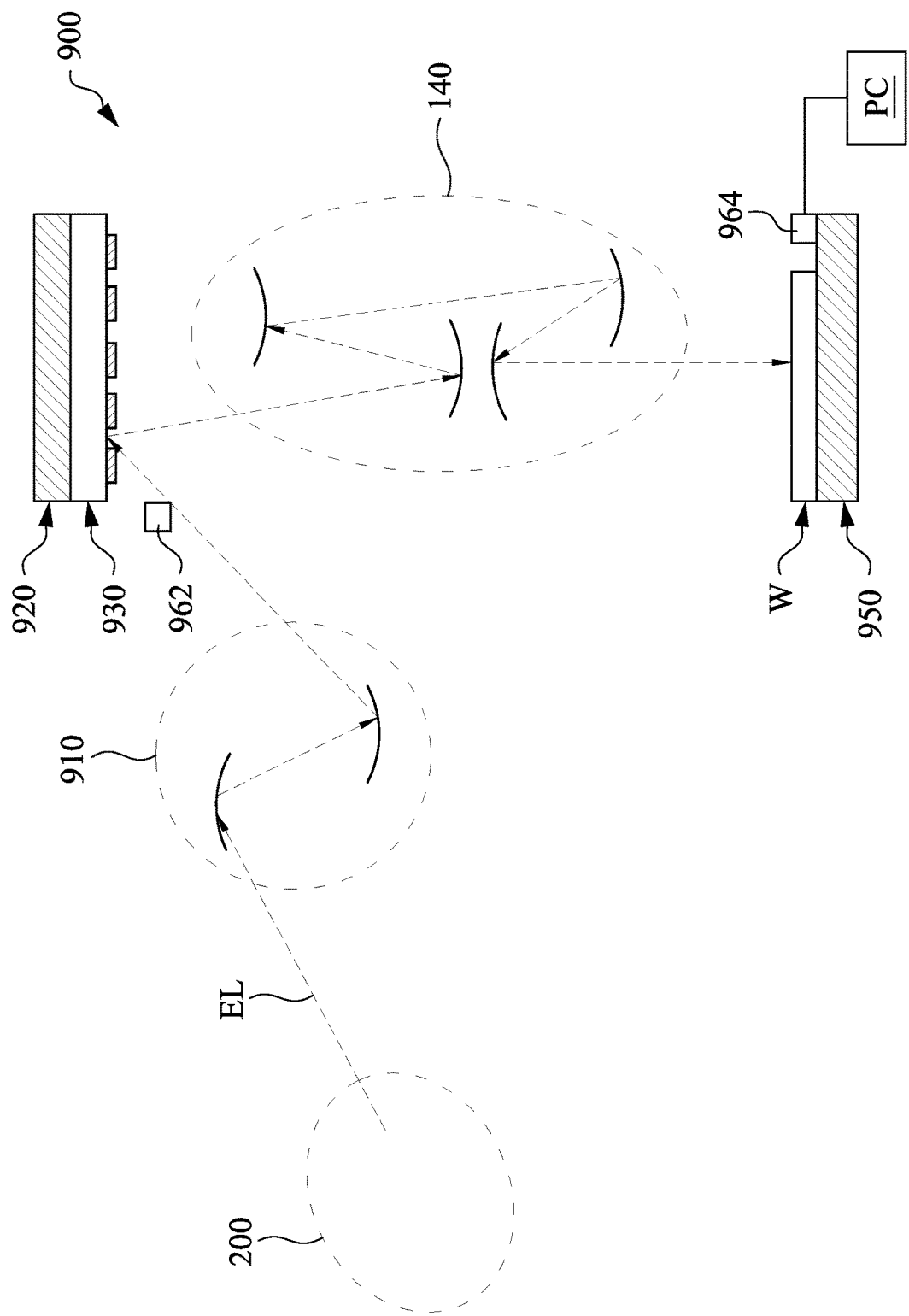
FIG. 16 is a schematic view of a lithography system according to some embodiments of the present disclosure.

In some embodiments, the EUV radiation source 200 may be optically coupling with a scanner (i.e., a lithography system 900 as shown in FIG. 16). The EUV radiation source 200 may include a vessel 210, a laser source 220, a collector 230, a bellow assembly BW, a target droplet generator 240, a droplet catcher 250, and a lower cone structure 260. In some embodiments, the vessel 210 has a cover 212 surrounding itself ventilation. The cover 212 may be configured around the collector 230. The laser source 220 may be at a bottom side of the vessel 210 and below the collector 230. In some embodiments, the bellow assembly BW is configured for receiving the droplet generator 240, and has an end connected to a port 210G of the vessel 210. The droplet catcher 250 may be installed opposite the port 210G of the vessel 210. In some embodiments, the lower cone structure 260 has a cone shape with its wide base integrated with the cover 212 and its narrow top section facing the scanner (i.e., the lithography system 900). The cone shape of the lower cone structure 260 tapers toward an exit aperture 210O of the vessel 210. The radiation source 200 may further include an intermediate focus (IF)-cap module 290 out of the exit aperture 210O, and the IF-cap module 290 is configured to provide intermediate focus to the EUV radiation EL.

The droplet generator 240 may include a reservoir 242 and a nozzle 244 connected to the reservoir 242. In some embodiments, the reservoir 242 may contain a suitable fuel material TD that is capable of creating a radiation in the EUV range when being converted to a plasma state. For example, the fuel material TD may include water, tin, lithium, xenon, or the like. In some embodiments, the element tin can be pure tin (Sn); a tin compound, for example, $SnBr_4$, $SnBr_2$, $SnH_4$; a tin alloy, for example, tin-gallium alloys, tin-indium alloys, tin-indium-gallium alloys, or any other suitable tin-containing material. In some embodiments, by assembling the droplet generator 240 onto the port 210G of the vessel 210, the space in the vessel 210 is closed.

Figure 3A:
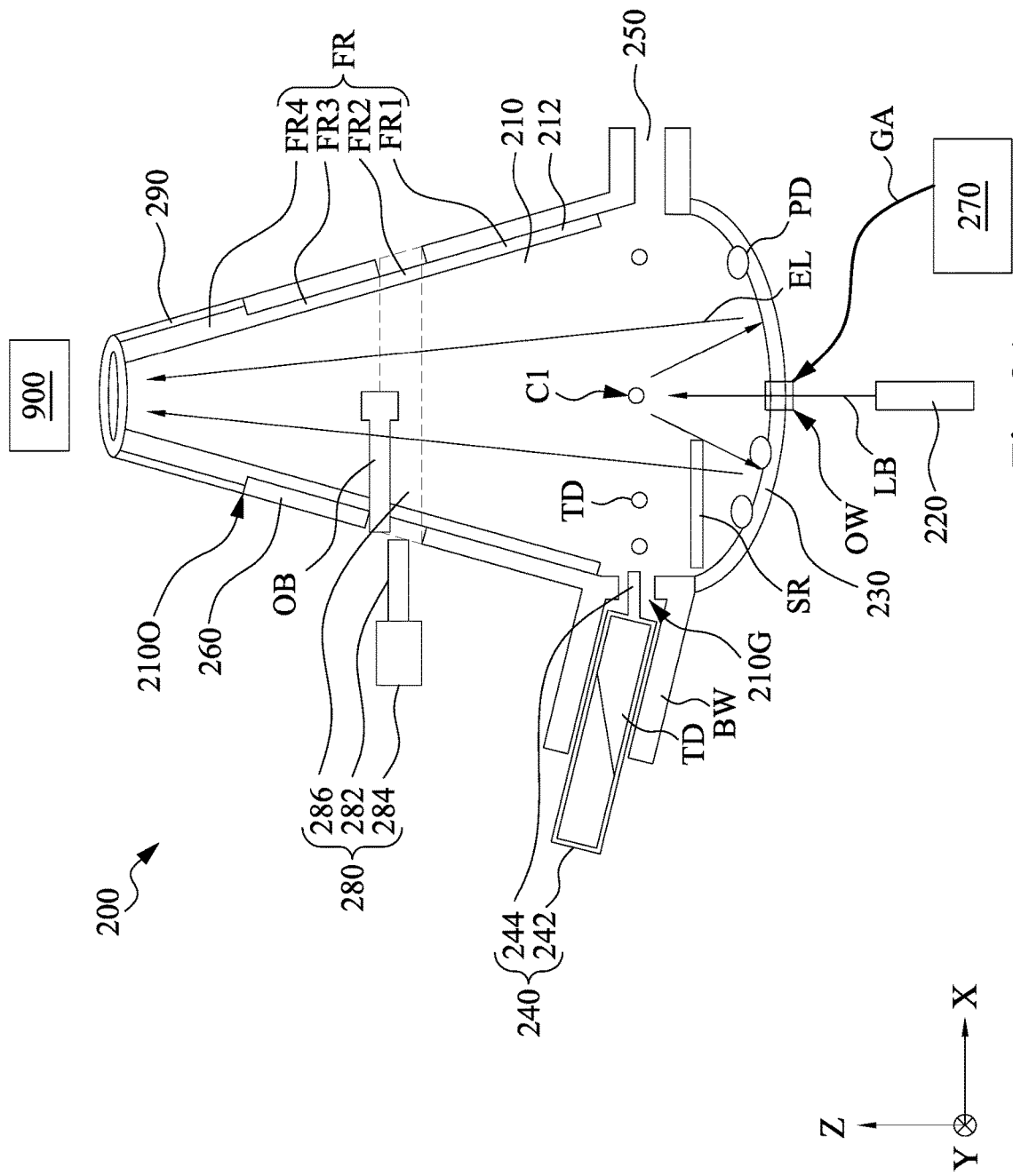

Referring to FIGS. 1A and 3A, the method proceeds to the step 104, where the droplet generator 240 ejects droplets of the fuel material TD into the space in the vessel 210 of the radiation source 200. In the present embodiments, the fuel material TD contained in the reservoir 242 is forced out of the reservoir 242 and the nozzle 244, thereby generating the droplets of the fuel material TD through the nozzle 244. The fuel material TD may be delivered in the form of liquid droplets, a liquid stream, solid particles or clusters, solid particles contained within liquid droplets or solid particles contained within a liquid stream. In some embodiments, the droplet generator 240 may release the droplet of the fuel material TD substantially along a X direction.

Still referring to FIGS. 1A and 3A, the method proceeds to the step 106, a laser beam LB is impinged onto the droplet of the fuel material TD for producing EUV light EL out of the vessel 210. In some embodiments, the EUV light EL has a wavelength ranging between about 1 nm and about 100 nm. In certain examples, the EUV light EL has a wavelength range centered at about 13.5 nm. In some embodiments, the laser source 220 may include a carbon dioxide ($CO_2$) laser source, a neodymium-doped yttrium aluminum garnet (Nd:YAG) laser source, or another suitable laser source to generate a laser beam LB. The laser beam LB is directed through an output window OW integrated with the collector 230. The output window OW adopts a suitable material that is substantially transparent to the laser beam LB. The laser beam LB is directed to heating the fuel material TD, such as tin droplets, thereby generating high-temperature plasma (e.g., ionized tin droplets) which further produces the EUV light EL. The pulses of the laser source 220 and the droplet ejecting rate of the droplet generator 240 are controlled to be synchronized, such that the fuel material TD receives peak power consistently from the laser pulses of the laser source 220. In some embodiments, the EUV radiation source 200 employs a laser produced plasma (LPP) mechanism to generate plasma and further generate EUV light EL from the plasma. In some alternative embodiments, the radiation source 200 may employ a dual LPP mechanism in which the laser source 220 is a cluster of multiple laser sources.

In some embodiments, the laser beam LB may or may not hit every droplet of the fuel material TD. For example, some droplets of the fuel material TD may be purposely missed by the laser beam LB. In the present embodiments, the droplet catcher 250 is installed opposite the target droplet generator 240 and in the direction of the movement of the droplet of the fuel material TD. The droplet catcher 250 is configured to catch any droplets of the fuel material TD that are missed by the laser beam LB.

The collector 230 may collect the EUV light EL, and reflect and focus the EUV light EL to the lithography system 900, thereby performing a lithography processes, which is illustrated in FIG. 16. The collector 230 is designed with suitable coating material and shape, functioning as a mirror for EUV collection, reflection, and focus. In some examples, the coating material of the collector 230 includes a reflective multi-layer (such as a plurality of Mo/Si film pairs) and may further include a capping layer (such as Ru) coated on the reflective multi-layer to substantially reflect the EUV light. An optic axis of the collector 230 may be along a Z direction, which is orthogonal to the X direction that the droplet generator 240 generates the droplet of the fuel material TD substantially along, such that the EUV radiation source 200 may emits the EUV light EL substantially along the Z direction. In some examples, the collector 230 is designed to have an ellipsoidal geometry. Through steps 104 and 106, the EUV radiation source 200 may emit EUV light EL, thereby performing one or more lithography processes on one or more semiconductor wafers. When EUV radiation source 200 emits EUV light EL, the space in the vessel 210 (e.g., the space surrounded the cover 212) is maintained in a vacuum environment since the air absorbs the EUV radiation.

In some embodiments, the radiation source 200 may include a shroud SR below the port 210G. The shroud SR may be made of suitable material, such as ceramics. The shroud SR may extend substantially along the X direction that the droplet generator 240 generates the droplet of the fuel material TD substantially along. The shroud SR may obscure some unshaped fuel material TD (e.g., not in the form of droplet) released from the droplet generator 240, thereby protecting the collector 230 from being contaminated by the unshaped fuel material TD. The shroud SR may have an end fixed to a top side of the collector 230. In some embodiments, a length of the shroud SR may be less than a radius of a top side of the collector 230, such that the shroud SR may not obscure a plasma-formation point C1 (interchangeably referred to as zone of excitation where droplets are excited by laser) where the laser beam LB hits the droplet of the fuel material TD. For example, the target droplet of the fuel material TD may be ejected from the droplet generator 240 to a zone of excitation (i.e., plasma-formation point C1) in front of the collector 230, and the laser beam LB is emitted toward the zone of excitation (i.e., plasma-formation point C1), such that the target droplet of the fuel material TD is heated by the excitation laser to generate EUV radiation. In some embodiments, the plasma-formation point C1 may substantially locate at the optic axis of the collector 230 along the Z direction.

In some cases, ionized tin droplets may cool down and become liquids and small particles, which are collectively referred to as debris. Some of the debris (referred to as debris PD hereinafter) may deposit onto a surface of the collector 230, thereby causing contamination thereon. The reflectivity of the collector degrades due to the debris accumulation and other factors such as ion damages, oxidation, and blistering, such that an intensity of the EUV light EL in the lithography process (referring to FIGS. 3A and 16) decreases, which in turn will lower the productivity of the lithography process (referring to FIGS. 3A and 16). In some embodiments, during or after the lithography process (referring to FIGS. 3A and 16), the method proceeds to the step 108 where an intensity of EUV light is measured by suitable light intensity sensors (e.g., the light intensity sensors 962 and 964 in FIG. 16). Suitable inspection and calculation methods may be performed to calculate the intensity of the EUV light EL, so as to infer a condition of the contamination on the collector 230.

Figure 3B:
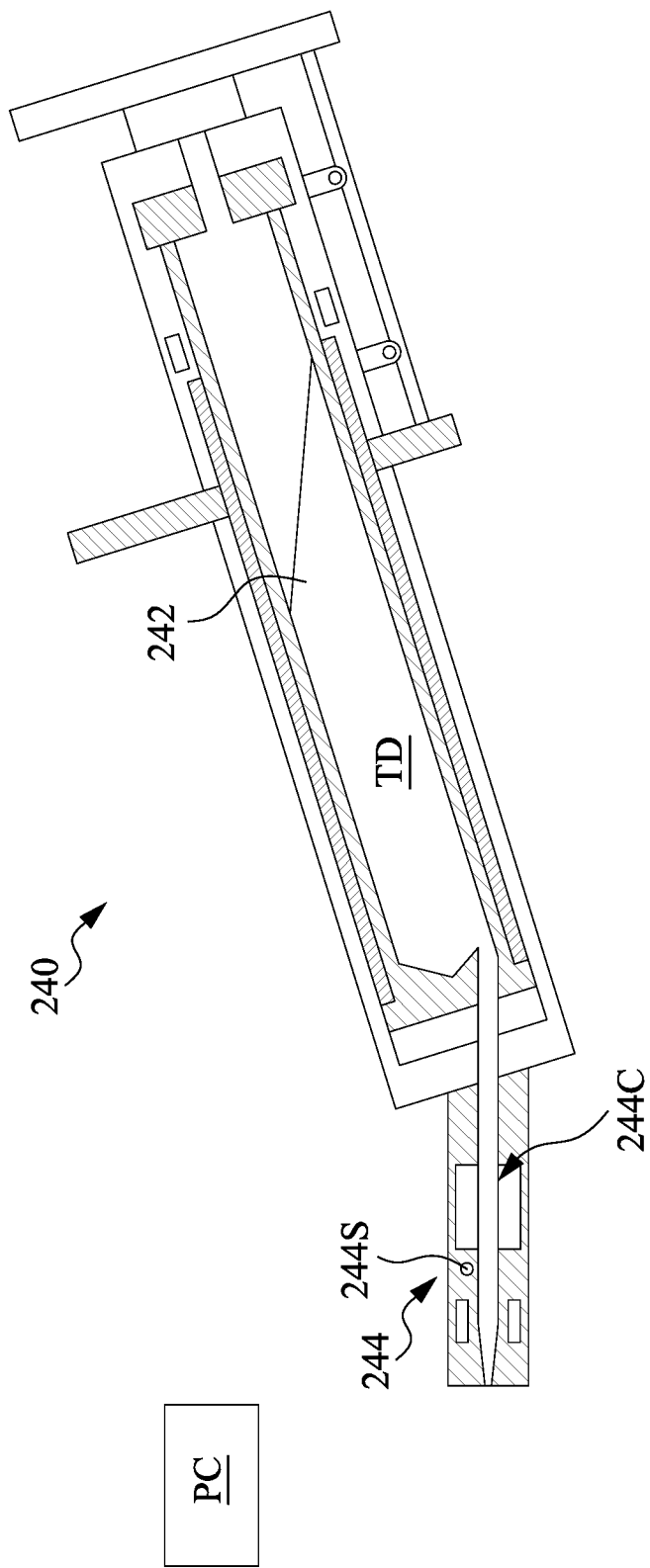
FIG. 3B illustrates a enlarge view of a droplet generator according to some embodiments of the present disclosure.
Figure 4:
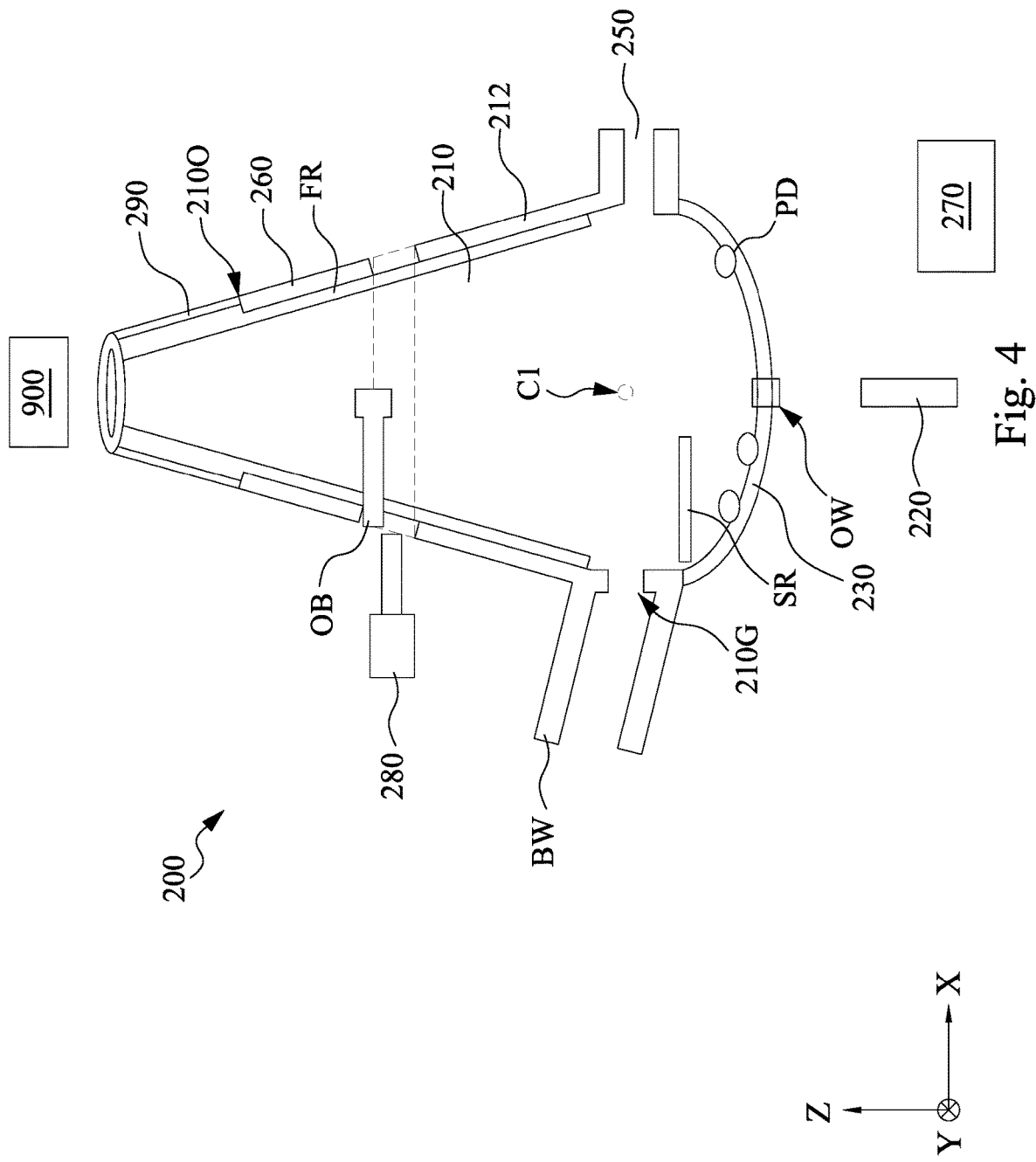

Contaminations in the fuel material TD may result in clogging (i.e., at least partial blocking) of the nozzle 244, which may impose a lifetime limit on the nozzle. In some embodiments, during the lithography process (referring to FIGS. 3A and 16), a clogging condition of the nozzle 244 of the droplet generator 240 is detected. For example, referring to FIG. 3B, a sensor 244S of the nozzle 244 may detect a pressure in a capillary tube 244C of the nozzle 244, and a controller PC electrically connected with the sensor 244S may receive a signal from the sensor 244S in response to the detected pressure. The controller PC may determine whether to perform a maintenance process according to the signal from the sensor 244S. For example, if the pressure measured by the sensor 244S is too high (e.g., higher than a determined value, such as 400 psi), the nozzle may be damaged so that tin clog at its head, and the maintenance process would be conducted for replacing the droplet generator 240 with a new one. Referring to FIGS. 1A and 4, the method 100 proceeds to the step 112, where the droplet generator 240 (referring to FIG. 3A) is disassembled from the port 210G of the vessel 210 of the EUV radiation source 200. For example, the port 210G is free of a droplet generator. In some embodiments, prior to the maintenance process (e.g., the disassembling the droplet generator 240 from the port 210G of the vessel 210), the droplet generator 240 stops ejecting the target droplet of the fuel material TD. In other words, the droplet generator 240 may be turned off prior to the maintenance process (e.g., the disassembling the droplet generator 240 from the port 210G of the vessel 210). In some embodiments, disassembling the droplet generator 240 from the port 210G would break the vacuum in the vessel 210, and elements of the EUV radiation source 200 may stop operating. For example, the laser source 220 may be turned off prior to the maintenance process (e.g., the disassembling the droplet generator 240 from the port 210G of the vessel 210), such that the laser beam LB may not emit into the vessel 210 during or after disassembling the droplet generator 240 from the port 210G.

The controller PC may be a part of an overall EUV radiation source 200. The robot controller PC may include electronic memory and one or more electronic processors configured to execute programming instructions stored in the electronic memory. In some embodiments, the robot controller PC may include processors, central processing units (CPU), multi-processors, distributed processing systems, application specific integrated circuits (ASIC), or the like.

The method 100 proceeds to the step 114 (referring to FIG. 3A), where a determination whether to clean the collector is made according to the measured intensity of EUV light. In some embodiments, a controller (e.g., the controller PC) may be electrically connected with the light intensity sensors 962 and 964 (referring to FIG. 16). The controller PC may receive signal from the light intensity sensors 962 and 964 (referring to FIG. 16) and determine whether to perform a clean process according to the signals from the light intensity sensors 962 and 964 (referring to FIG. 16). In some embodiments, the measured intensity of EUV light EL is compared with a reference value measured when the collector 230 is clean. If the detected intensity of EUV light EL is lower than the reference value by more than a certain percentage (e.g., about 10% to about 50%), the method 100 proceeds to steps 116-118, where a cleaning process is performed to the collector 230. In other words, the maintenance process of the droplet generator is performed with the cleaning process. If the detected intensity of EUV light EL is lower than the reference value by less than the certain percentage (e.g., about 10% to about 50%), the method 100 skips the steps 116-122 and proceeds to step 124, where a new droplet generator is assembled onto the port 210G of the vessel 210 without cleaning the collector 230. In other words, the maintenance process of the droplet generator may be performed without the cleaning process.

Figure 5A:
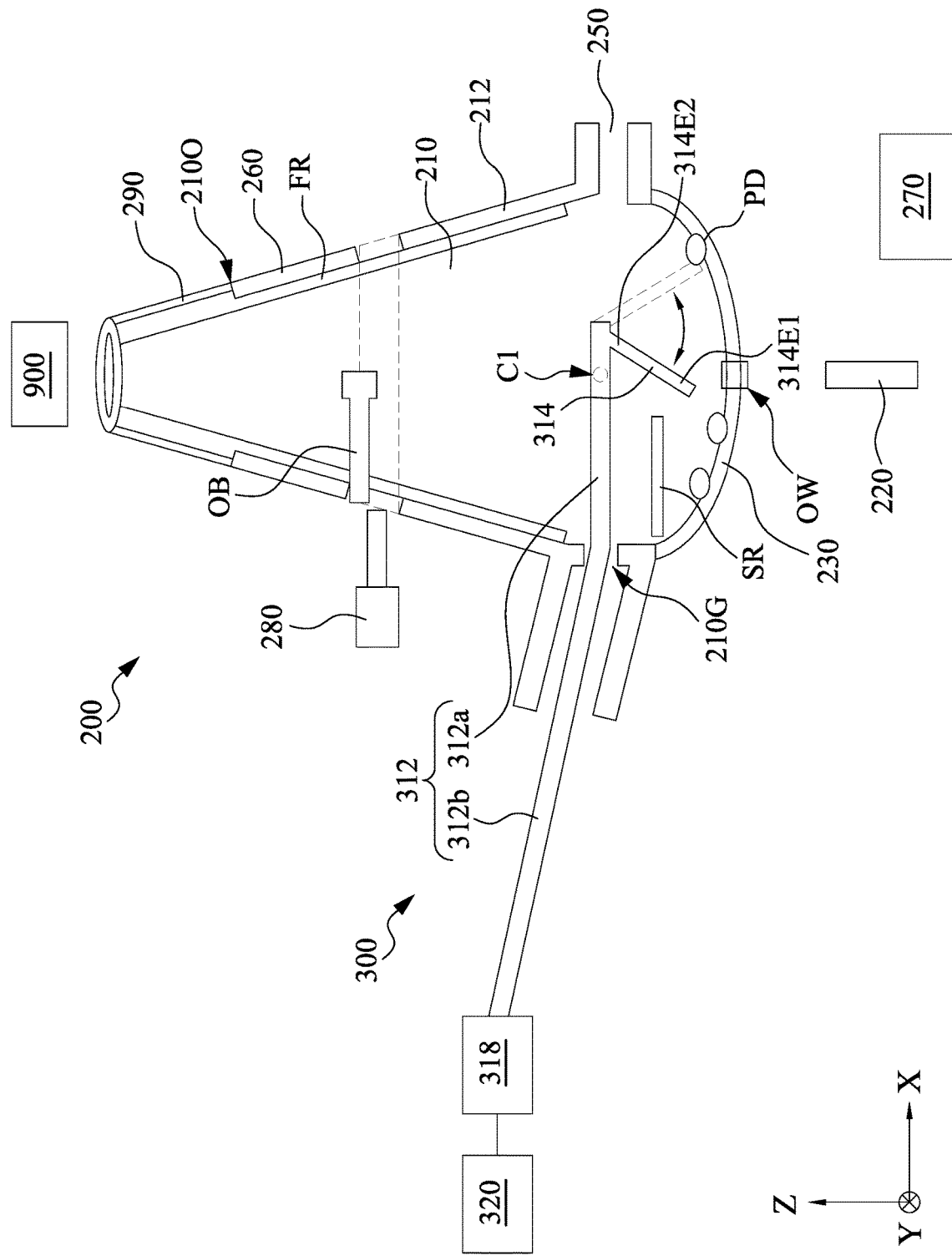
Figure 5B:
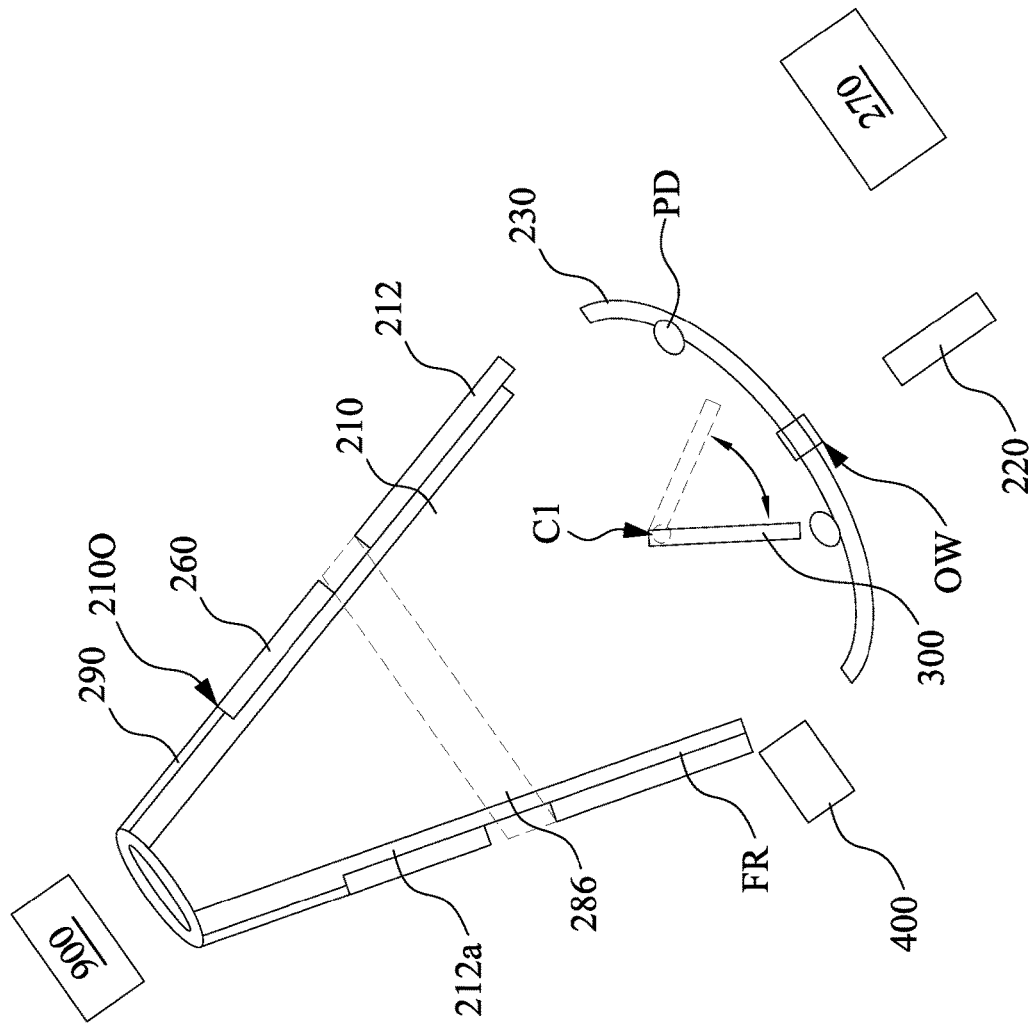
Figure 5C:
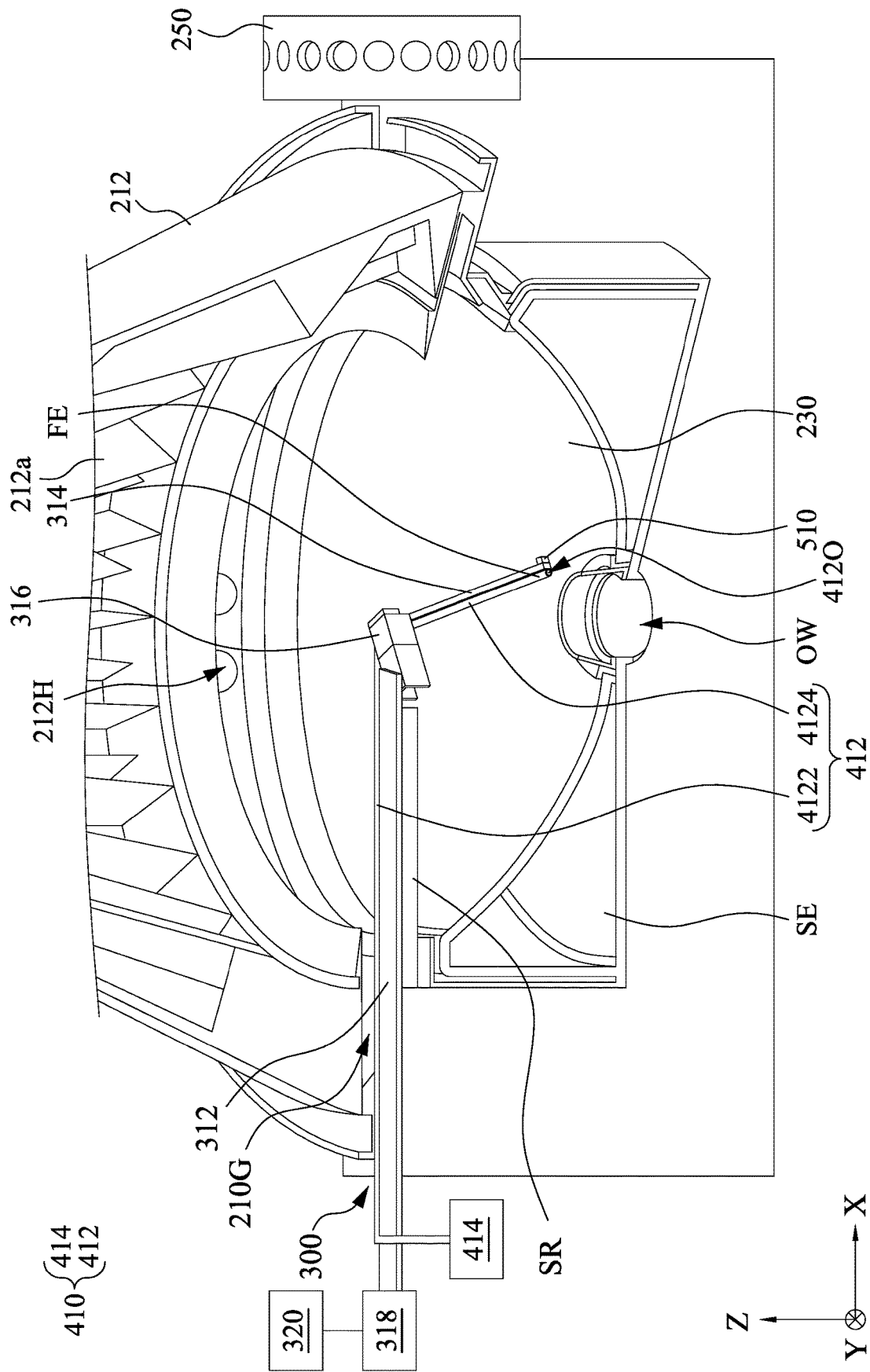
FIG. 5C is schematic view of a portion of an EUV radiation source and a robot arm according to some embodiments of the present disclosure.

Reference is made to FIGS. 1B and 5A-5C. FIG. 5A illustrates a schematic side view of the EUV radiation source 200 along a direction Y according to some embodiments of the present disclosure. FIG. 5B illustrates a schematic side view of the EUV radiation source 200 of FIG. 5A along the direction X, in which the direction X, Y, and Z are orthogonal to each other. FIG. 5C is a schematic view of a portion of an EUV radiation source 200 and a robot arm 300 according to some embodiments of the present disclosure. If the determination determines that the collector 230 requires cleaning, the method 100 proceeds to the step 116, where a robot arm 300 is inserted into the vessel 210 through the port 210G. In the present embodiments, the robot arm 300 may hold a cleaning device 410 (referring to FIG. 5C). By using the cleaning device 410, the method 100 may proceed to the step 118, where an in-line cleaning process is performed to the collector. In some embodiments, at steps 116 and 118, the collector 230 may be cleaned during the maintenance process without moving the collector 230, which is referred to as in-line cleaning process. The in-line cleaning process can extend the lifetime of the collector and gains lots of tool time for productivity. For clear illustration, the EUV radiation source 200 in FIG. 5B is illustrated as being tilted for optically coupling with the scanner (i.e., the lithography system 900). For example, the direction Z that the EUV light EL emits along is inclined with respect to a direction of gravity (i.e., a direction G in FIG. 5B).

In some embodiments, the robot arm 300 may include an extending arm portion 312 and a movable arm portion 314, in which the movable arm portion 314 can rotate with respect to the extending arm portion 312. In some embodiments, the movable arm portion 314 may also be referred to an arm segment coupled to the extending arm portion 312. In some embodiments, the extending arm portion 312 may include one or more arm segments connected in sequence. For example, a front end 314E1 of the movable arm portion 314 of the robot arm 300 can be moved from a first position in the vessel 210 to a second position in the vessel 210. In some embodiments, when the movable arm portion 314 is moved, the extending arm portion 312 is held static. For example, the back end 314E2 of the movable arm portion 314 may remain at the same position when the front end 314E1 of the movable arm portion 314 is moved from the first position to the second position.

In some embodiments of the present disclosure, for preventing the movable arm portion 314 from hitting the shroud SR, the extending arm portion 312 of the robot arm 300 is longer than the shroud SR and extends further than the shroud SR does. In other words, the extending arm portion 312 of the robot arm 300 may extend beyond the shroud SR. For example, a length of the extending arm portion 312 of the robot arm 300 may be greater than the radius of a top side of the collector 230. Through the configuration, the extending arm portion 312 of the robot arm 300 may extend beyond the plasma-formation point C1, and the back end 314E2 of the movable arm portion 314 is not located at the plasma-formation point C1. In some alternative embodiments, the extending arm portion 312 of the robot arm 300 may extend further than the shroud SR does, but not extend beyond the plasma-formation point C1. In some embodiments, the back end 314E2 of the movable arm portion 314 may be located at the plasma-formation point C1.

Referring to FIG. 5C, the cleaning device 410 is used to clean the debris PD (referring to FIGS. 5A and 5B) accumulated on the surface of the collector 230. The cleaning device 410 may include an extraction tube 412 clamping on the robot arm 300 and a pump 414 connected to the extraction tube 412 and external to the vessel 210. The pump 414 may draw gas from a vessel 210 connected with the extraction tube 412. In some embodiments, the extraction tube 412 may be referred to as a vacuum tube. In some embodiments, the pump 414 may be referred to as a vacuum pump. The robot arm 300 with the extraction tube 412 is inserted into an EUV vessel 210 through the port 210G, such that the collector 230 can be cleaned without being removed.

In some embodiments, the extraction tube 412 may include a first portion 4122 and a second portion 4124 continuously connected to the first portion 4122, and the first and second portions 4122 and 4124 are respectively fixed to the extending arm portion 312 and the movable arm portion 314 of the robot arm 300. Though the configuration, the first and second portions 4122 and 4124 of the extraction tube 412 can be moved in a way similar to the movement of the extending arm portion 312 and the movable arm portion 314 of the robot arm 300. In some embodiments, by moving/rotating the movable arm portion 314 of the robot arm 300, the second portion 4124 can be moved or rotated with respect to the first portion 4122. For example, a front end FE of the second portion 4124 of the extraction tube 412 can be moved from a first position in the vessel 210 to a second position in the vessel 210. In some embodiments, an opening 412O of the extraction tube 412 may be mounted on the front end 314E1 of the movable arm portion 314 of the robot arm 300. In some embodiments, by rotating the portion 314 of the robot arm 300, the opening 412O of the extraction tube 412 is moved to suitable position to provide a vacuuming suction force to the surface of the collector 230. By vacuuming the surface of the collector 230, to the cleaning device 410 may remove the debris PD (referring to FIGS. 5A and 5B), thereby cleaning the collector 230.

Figure 5D:
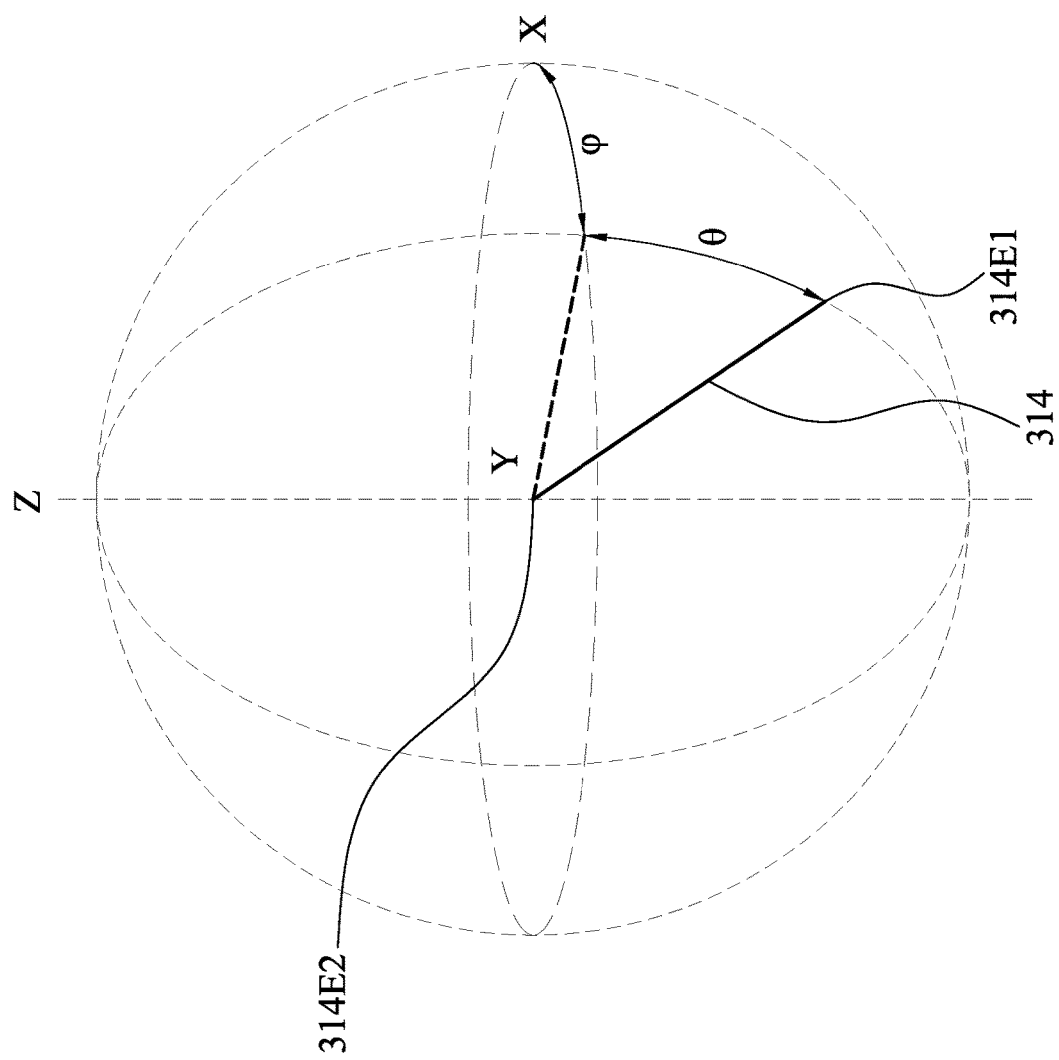
FIG. 5D illustrates a movement of the robot arm in three-dimensional space according to some embodiments of the present disclosure.

Referring to FIG. 5C, in some embodiments, the robot arm 300 may include one or more joints connected between the arm portions. For example, the robot arm 300 include a joint 316 connected between the extending arm portion 312 and the movable arm portion 314. The joint 316 allows the rotation of the movable arm portion 314 relative to the extending arm portion 312. For example, the joint 316 may include an adaptor connected between the extending arm portion 312 and the movable arm portion 314. FIG. 5D illustrates a movement of the robot arm 300 in three-dimensional space with axes in X, Y, Z direction according to some embodiments of the present disclosure. Referring to FIG. 5D, the movable arm portion 314 of the robot arm 300 can be rotated with a variable altitude angle $\theta$ with respect to the X-Y plane and/or a variable azimuth angle $\varphi$ with about the Z direction (illustrated with respect to the X-Z plane). For example, the azimuth angle $\varphi$ can be in a range of about 0 degree to about 360 degrees. For example, the altitude angle $\theta$ can be in a range of about 0 degree to about 360 degrees, or about 0 degree to about 180 degrees. Through the configuration, the robot arm 300 can achieve two-degree-of-freedom for 360-degree cleaning. By adjusting the azimuth angle $\varphi$ and/or altitude angle $\theta$, as viewed from top, the front end 314E1 of the movable arm portion 314 is moved or rotated with respect to the back end 314E2 of the movable arm portion 314.

In some embodiments, when cleaning the surface of the collector 230, the front end 314E1 of the movable arm portion 314 may move to a position between the point C1 (e.g., X-Y plane at point C1) and the collector 230. For example, when cleaning the surface of the collector 230, the altitude angle $\theta$ of the movable arm portion 314 with respect to the extending arm portion 312 may be in a range from about 0 degree to about 180 degrees. Through the configuration, the front end 314E1 of the movable arm portion 314 may be close to the collector 230, thereby easily vacuuming debris on the surface of the collector 230.

Referring back to FIGS. 5A-5C, in some embodiments, the robot arm 300 may include a drive assembly 318 coupled to the joint 316 of the robot arm 300, the drive assembly 318 may have a plurality of drive elements (e.g., rotational motors) for rotation. In some embodiments, the drive assembly 318 may include at least two drive elements (e.g., rotational motors) coupled to the robot arm 300 for providing at least two degrees of freedom to the movable arm portion 314. As discussed above, the two degrees of freedom of movement may include the rotation of the movable arm portion 314 about the Z direction (e.g., having variable azimuth angle φ with respect to the X-Z plane in FIG. 5D) and the rotation of the movable arm portion 314 with respect to the X-Y plane (e.g., having variable altitude angle θ with respect to the X-Y plane in FIG. 5D). The drive assembly 318 may be electrically connected to a robot controller 320, which may control the rotation of the joint 316 to move the movable arm portion 314.

In some alternative embodiments, the drive assembly 318 may include one drive element (e.g., a rotational motor) coupled to the robot arm 300 for providing one degree of freedom to the movable arm portion 314. In some examples, the one degree of freedom of movement may include the rotation of the movable arm portion 314 about the Z direction (e.g., having variable azimuth angle φ with respect to the X-Z plane in FIG. 5D). In some alternative examples, the one degree of freedom of movement may include the rotation of the movable arm portion 314 with respect to the X-Y plane (e.g., having variable altitude angle θ with respect to the X-Y plane in FIG. 5D).

In still some alternative embodiments, the drive assembly 318 may include more than two drive elements (e.g., rotational motors) coupled to the robot arm 300 for providing more than two degrees of freedom to the movable arm portion 314. For example, the drive assembly 318 may include three drive elements (e.g., rotational motors) for providing three degrees of freedom to the movable arm portion 314. Four or five degrees of freedom may also be applicable for the movement of the movable arm portion 314 in some embodiments. In the present embodiments, the drive elements of drive assembly 318 are illustrated at an external portion of the robot arm 300. In some other embodiments, one or more drive elements of drive assembly 318 may be directly mounted on the corresponding joint 316 of the robot arm 300 and coupled to the joint 316 for allowing the movement of the movable arm portion 314.

The robot controller 320 may be a part of an overall EUV radiation source 200, of which the robot arm 300 is a part. The robot controller 320 may include electronic memory and one or more electronic processors configured to execute programming instructions stored in the electronic memory, which may involve a program controlling the rotation of the joint 316 and the movement of the robot arm 300. In some embodiments, the robot controller 320 may include processors, central processing units (CPU), multi-processors, distributed processing systems, application specific integrated circuits (ASIC), or the like.

Referring to FIG. 5C, in some further embodiments, the robot arm 300 may optionally hold a detector 510. Also, by using the detector 510, the method 100 may proceed to the step 120, where a condition of the lower cone structure 260 (referring to FIGS. 5A and 5B) is detected. The detector 510 may be used for detecting a tin contamination on the lower cone structure 260 (referring to FIGS. 5A and 5B) in images or videos. For example, the detector 510 can be an image detector (e.g., camera) including plural image sensors. In some embodiments, a detector 510 may be mounted on the movable arm portion 314 of the robot arm 300 by suitable fixing elements (e.g., clamps). Through the configuration, by rotating the movable arm portion 314 of the robot arm, the detector 510 may be moved to suitable position to inspect the lower cone structure 260. The images or videos may be used as a reference to understand the extent of tin contamination in the vessel 210.

In some embodiments, when detecting a condition of tin contamination on the lower cone structure, the movable arm portion 314 holding the detector 510 can be rotated with the azimuth angle φ (referring to FIG. 5D) in a range of about 0 degree to about 360 degrees, and the altitude angle θ (referring to FIG. 5D) in a range of about 0 degree to about 360 degrees. In some embodiments, when detecting a condition of tin contamination on the lower cone structure, the front end 314E1 of the movable arm portion 314 (or the detector 510) may move to a position between the point C1 (e.g., X-Y plane at point C1) and the exit aperture 210O. That is, in these embodiments, the front end 314E1 of the movable arm portion 314 (or the detector 510) may be far away from the collector 230 when detecting a condition of tin contamination on the lower cone structure, not close to the collector 230 as cleaning the surface of the collector 230. In some other embodiments, when detecting a condition of tin contamination on the lower cone structure, the front end 314E1 of the movable arm portion 314 (or the detector 510) may move to a position between the point C1 (e.g., X-Y plane at point C1) and the collector 230. That is, in these embodiments, the front end 314E1 of the movable arm portion 314 (or the detector 510) may be close to the collector 230 as detecting a condition of tin contamination on the lower cone structure.

In some embodiments, the front end 314E1 of the movable arm portion 314 can be moved from a first position in the vessel 210 to a second position in the vessel 210, in which the second position is different from the first position. For example, the azimuth angle φ (referring to FIG. 5D) of the movable arm portion 314 with the front end 314E1 at the first position is different from that of the movable arm portion 314 with the front end 314E1 at of the second position. Alternatively, for example, the altitude angle θ (referring to FIG. 5D) of the movable arm portion 314 with the front end 314E1 at the first position is different from that of the movable arm portion 314 with the front end 314E1 at of the second position. The detector 510 at the front end 314E1 of the movable arm portion 314 may capture a first image of the lower cone structure 260 at the first position in the vessel 210, and capture a second image of the lower cone structure 260 at the second position in the vessel 210. The first and second images of the lower cone structure 260 may show more detail information about the condition of tin contamination on the lower cone structure 260.

In the present embodiments, the extraction tube 412 and the detector 510 may be mounted on the same movable arm portion 314 of the robot arm 300. In some other embodiments, the extraction tube 412 and the detector 510 may be mounted on the different portions of the robot arm 300. In some embodiments, the detection of the lower cone structure 260 (i.e., the step 120 in FIG. 1B) may be performed before, during, or after the in-line cleaning process (i.e., the step 118 in FIG. 1B). In some embodiments, the detection of the lower cone structure 260 (i.e., the step 120 in FIG. 1B) may be omitted.

In some embodiments, the radiation source 200 may include a supporting structure SE for supporting the collector 230. The supporting structure SE may include a rigid frame or box accommodating some auxiliary modules, such as a cooling module for controlling a temperature of laser source 220. In some embodiments, during the in-line cleaning process and/or detecting a condition of the lower cone structure 260 (referring to FIGS. 5A and 5B), the collector 230 is kept supported by the supporting structure SE. In other word, the collector 230 is not moved out of EUV radiation source 200 during the in-line cleaning process and/or detecting a condition of the lower cone structure 260 (referring to FIGS. 5A and 5B).

Referring back to FIG. 5A, in some embodiments, the extending arm portion 312 has a first arm segment 312a in the vessel 210 and a second arm segment 312b external to the vessel 210. In some embodiments, the first arm segment 312a is substantially parallel with the X direction, and the second arm segment 312b extends along a longitudinal direction of the bellow assembly BW. In some embodiments, for fitting the configuration of the bellow assembly BW and the vessel 210, a longitudinal direction of the first arm segment 312a may tilt with respect to a longitudinal direction of the second arm segment 312b. In some further embodiments, the first arm segment 312a may be moved or rotated with respect to the second arm segment 312b, such that an angle between the longitudinal directions of the first arm segment 312a and the second arm segment 312b can be adjusted for fitting the configuration of the bellow assembly BW and the vessel 210. In some other embodiments, the angle between the longitudinal directions of the first arm segment 312a and the second arm segment 312b can be fixed and not adjustable.

In some embodiments, prior to inserting the robot arm 300 into the vessel 210 through the bellow assembly BW, the front end 314E1 of the movable arm portion 314 may be rotated to a suitable position, thereby shrinking a size of a cross-section of the robot arm 300. Through the configuration, the robot arm 300 can be moved into the vessel 210 through the bellow assembly BW, without damaging the port 210G or the bellow assembly BW. For example, the movable arm portion 314 may be substantially aligned with the extending arm portion 312, or rotated to have a small angle with the extending arm portion 312, such that the robot arm 300 can be easily moved through the port 210G and the bellow assembly BW.

Referring to FIGS. 1B and 6, the method 100 proceeds to the step 122, where the robot arm 300 is drawn out from the vessel 210 and the bellow assembly BW. For example, the port 212G is free of the robot arm 300. In some embodiments, prior to drawing the robot arm 300 out of the vessel 210 and the bellow assembly BW, the front end 314E1 of the movable arm portion 314 may be rotated to a suitable position, thereby shrinking a size of a cross-section of the robot arm 300. Through the configuration, he robot arm 300 can be moved out from the vessel 210 and the bellow assembly BW, without damaging the port 210G or the bellow assembly BW. For example, the movable arm portion 314 be substantially aligned with the extending arm portion 312, or rotated to have a small angle with the extending arm portion 312, such that the robot arm 300 can be easily moved through the port 210G and the bellow assembly BW.

Figure 7:
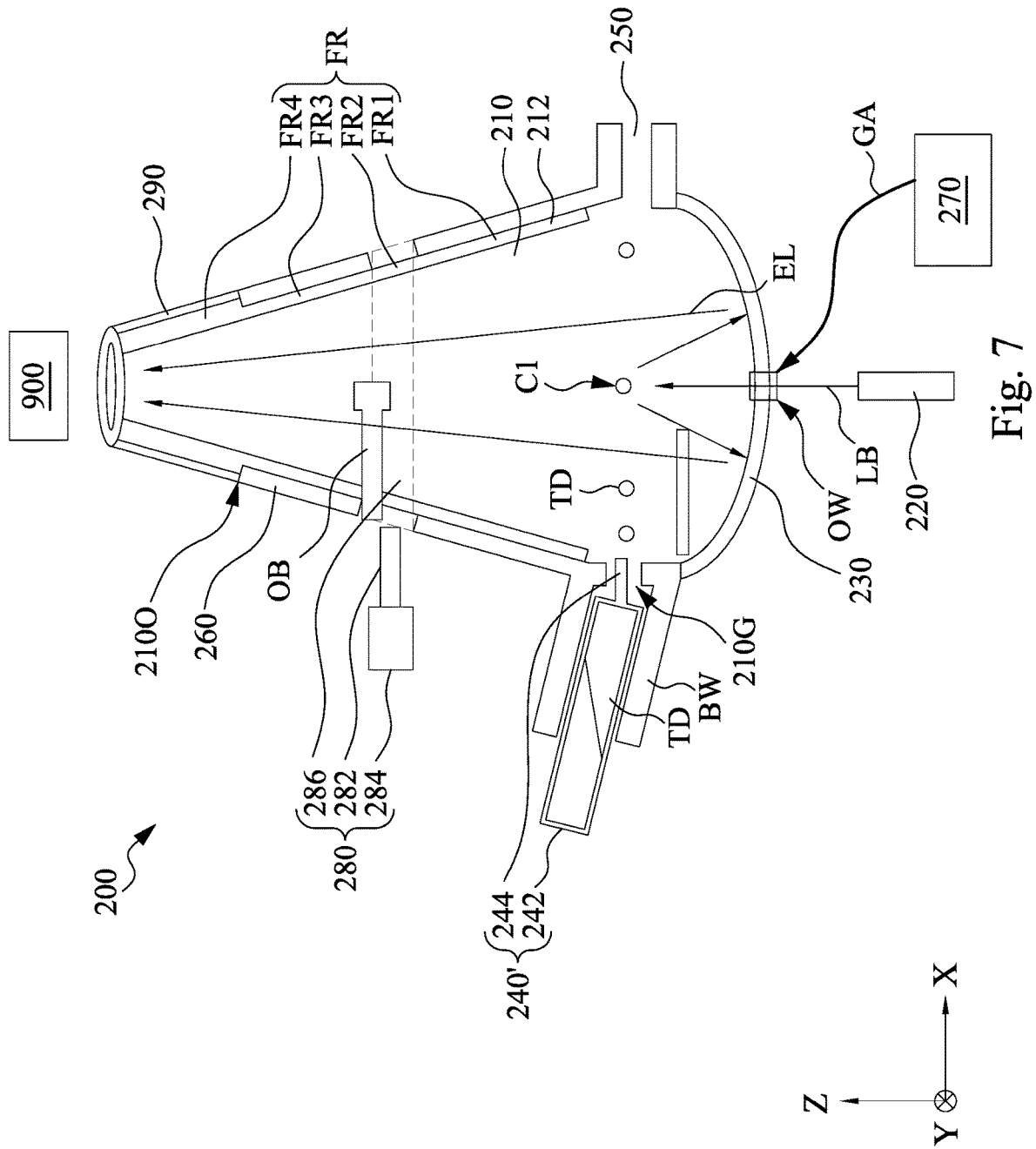

Referring to FIGS. 1B and 7, the method 100 proceeds to the step 124, where a droplet generator 240' is assembled onto the port 210G. In some embodiments, the droplet generator 240' may be different from the droplet generator 240 of FIG. 2. For example, in some embodiments, the nozzle 244 of the droplet generator 240 of FIG. 2 is clogged, the nozzle 244 of the droplet generator 240' is free of being clogged. Subsequently, the EUV radiation source 200 may emit EUV light EL as illustrated in FIG. 3A by repeating steps 104 and 106.

In some embodiments of the present disclosure, an in-line cleaning process is performed to clean the surface of the collector 230 for extending the lifetime of the collector. The in-line cleaning process can be performed without moving the collector 230 out of the vessel 210, thereby saving swap cost and gaining lots of tool time for productivity. For example, during the steps 112-124 of the methods 100, the collector 230 is kept supported by the supporting structure SE (FIG. 5C), and not moved out of EUV radiation source 200.

In the present embodiments, the cleaning process to the collector 230 is illustrated as in-line cleaning process, which is performed during replacing the droplet generator 240 with a new one. In some alternative embodiments, the cleaning process to the collector 230 may be performed alone, not along with the maintenance process for replacing the droplet generator 240 with a new one. For example, in FIG. 7, a used droplet generator 240 (as illustrated in FIG. 2) may be assembled back to the port 210G after cleaning the collector 230. Also, a method for detecting a condition of the lower cone structure 260 using the detector 510 may be performed alone, not along with the maintenance process for replacing the droplet generator 240 with a new one. For example, in FIG. 7, a used droplet generator 240 (as illustrated in FIG. 2) may be assembled back to the port 210G after detecting a condition of the lower cone structure 260.

Reference is made back to FIGS. 2-3A. In some embodiments, the radiation source 200 may include an intermediate focus (IF)-cap module 290 configured to provide intermediate focus to the EUV radiation EL. The collector 230 may focus the EUV light EL generated by the plasma toward the IF-cap module 290. The IF-cap module 290 is located between the EUV radiation source vessel 210 and the scanner (i.e., the lithography system 100) including optical elements configured to direct the EUV light EL to a workpiece (e.g., a semiconductor substrate). In some embodiments, the IF-cap module 290 may comprise a cone shaped aperture configured to provide for separation of pressures between the EUV radiation source vessel 210 and the scanner (i.e., the lithography system 100). In some embodiments, the IF-cap module 290 may extend into the scanner (i.e., the lithography system 100). The radiation source 200 may include a horizontal obscuration bar OB designed and configured to obscure the laser beam LB, thereby preventing the laser beam LB emits out of the vessel 210 through the exit aperture 210O. The horizontal obscuration bar OB may have an end fixed to a lower side of the cone structure 260.

In some embodiments, the cover 212 is made of a suitable solid material, such as stainless steel. The cover 212 of the vessel 210 may collects debris. For example, the cover 212 may include a plurality of vanes 212a, which are spaced around the cone-shaped cover 212. In some embodiments, the radiation source 200 further includes a heating unit disposed around part of the cover 212. The heating unit functions to maintain the temperature inside the cover 212 above a melting point of the debris so that the debris does not solidify on the inner surface of the cover 212. When the debris vapor comes in contact with the vanes, it may condense into a liquid form and flow into a lower section of the cover 212. The lower section of the cover 212 may provide holes 212H (referring to FIG. 5C) for draining the debris liquid out of the cover 212, for example, to a fuel container 400 (referring to FIG. 5B). The fuel container 400 can collect liquid debris. In some embodiment, the tilt of the EUV radiation source 200 is designed such that the fuel container 400 is at a lower position than positions of the droplet generator 240 and the droplet catcher 250, which may also facilitate tin collection.

In some embodiments, the radiation source 200 further includes a gas flow mechanism, including a gas supply module 270, an exhaust system 280, and various pipelines for integrating the gas flow mechanism with the collector 240. The gas supply module 270 is configured to provide a gas GA into the vessel 210 and particularly into a space proximate the reflective surface of the collector 230. In some embodiments, the gas GA is hydrogen gas, which has less absorption to the EUV radiation. The gas GA is provided for various protection functions, which include effectively protecting the collector 230 from the contaminations by tin particles. Other suitable gas may be alternatively or additionally used. The gas GA may be introduced into the collector 240 through openings (or gaps) near the output window OW through one or more gas pipelines.

In some embodiments, the exhaust system 280 includes one or more exhaust lines 282 and one or more pumps 284. The exhaust line 282 may be connected to the wall of the vessel 210 for receiving the exhaust. In some embodiments, the cover 212 is designed to have a cone shape with its wide base integrated with the collector 240 and its narrow top section facing the illuminator 910. To further these embodiments, the exhaust line 282 is connected to the cover 212 at its top section. The pump 284 draws airflow from the vessel 210 into the exhaust line 282 for effectively pumping out the gas GA. The gas GA may also function to carry some debris away from the collector 230 and the cover 212 and into the exhaust system 280. In some embodiments, the exhaust system 280 may include a gas outlet structure 286 disposed at the entrance of the exhaust line 282. The gas outlet structure 286 may be a scrubber, which may scrub gas vapors or dilute the exiting gas before the gas is released out of the vessel 210.

In some embodiments, the radiation source 200 may include plural fuel receiving elements FR on inner sidewalls of the vessel 210. For example, a first portion FR1 of the fuel receiving elements FR near the cover 212 may include the vanes (e.g., the vanes 212a in FIG. 5C), a second portion FR2 of the fuel receiving elements FR near the gas outlet structure 286 may include plural vanes, a third portion FR3 of the fuel receiving elements FR near the lower cone structure 260 may include plural vanes, and a fourth portion FR4 of the fuel receiving elements FR near the IF-cap module 290 may include suitable coating layers. The shapes and densities of the vanes of the first to third portions FR1-FR3 may be different from each other. For example, a density of the vanes of the second portion FR2 is greater than a density of the vanes of the first portion FR1 (e.g., the vanes 212a in FIG. 5C). In some embodiments, the vanes of the third portion FR3 may be spiral that laterally guides the liquid debris. The receiving elements FR may receive the liquid debris and direct the liquid debris to flow into the fuel container 400 (referring to FIG. 5B).

Figure 8:
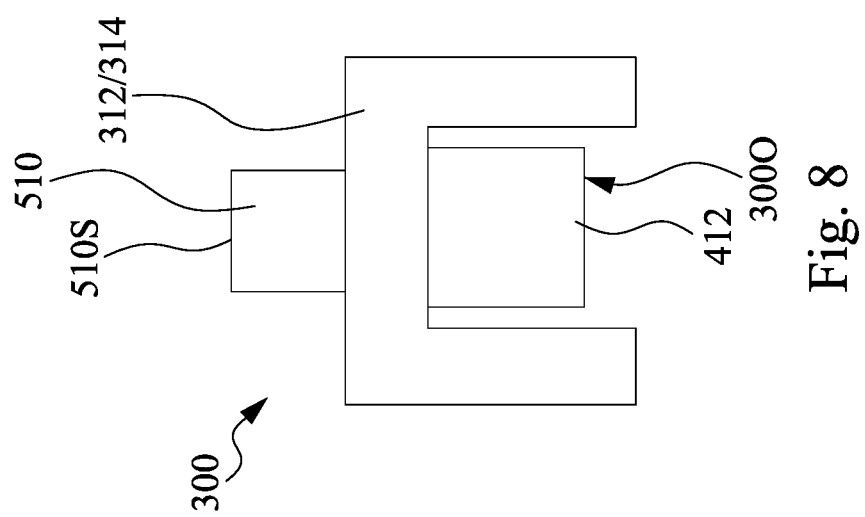

FIG. 8 is schematic view of a robot arm 300 holding an extraction tube 412 according to some embodiments of the present disclosure. In some embodiments, the arm portion 312 and/or 314 of the robot arm 300 includes a cavity 300O, and the extraction tube 412 may be disposed in the cavity 300O. The cavity 300O is illustrated as a trench in the present embodiments. In some other embodiments, the cavity 300O may be a space enclosed by solid walls of the robot arm 300, and the solid walls of the robot arm 300 may surround the extraction tube 412. The detector 510 may be located on an outer lateral side of the arm portion 312 and/or 314 of the robot arm 300, and having an image receiving surface 510S facing upward, thereby detecting a condition of the lower cone structure 260 (referring to FIGS. 5A and 5B). For example, the detector 510 may be located on the arm portion 312 and/or 314 of the robot arm 300. In some embodiments, the extraction tube 412 and the detector 510 may be fixed to the arm portion 312 and/or 314 of the robot arm 300 by suitable fixing elements (e.g., clamps). In some embodiments, one of the extraction tube 412 and the detector 510 may be omitted.

Figure 9:
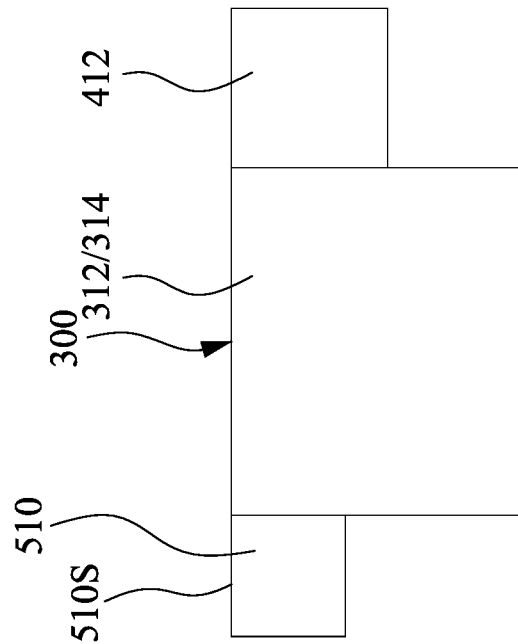
FIGS. 8 and 9 are schematic views of a robot arm holding an extraction tube according to some embodiments of the present disclosure.

FIG. 9 is schematic view of a robot arm 300 holding an extraction tube 412 according to some embodiments of the present disclosure. The present embodiments are similar to the embodiments of FIG. 8, except that the extraction tube 412 and the detector 510 may be located on outer side(s) of the arm portion 312 and/or 314 of the robot arm 300. For example, the extraction tube 412 and the detector 510 may be respectively located on opposite outer lateral sides of the arm portion 312 and/or 314 of the robot arm 300. Alternatively, the extraction tube 412 and the detector 510 may be respectively located on an outer lateral side and an outer top side of the arm portion 312 and/or 314 of the robot arm 300. In the present embodiments, the arm portion 312 and/or 314 of the robot arm 300 may be free of the cavity 300O shown in FIG. 8. In some alternative embodiments, the arm portion 312 and/or 314 of the robot arm 300 may has the cavity 300O shown in FIG. 8. In some embodiments, one of the extraction tube 412 and the detector 510 may be omitted.

Figure 10:
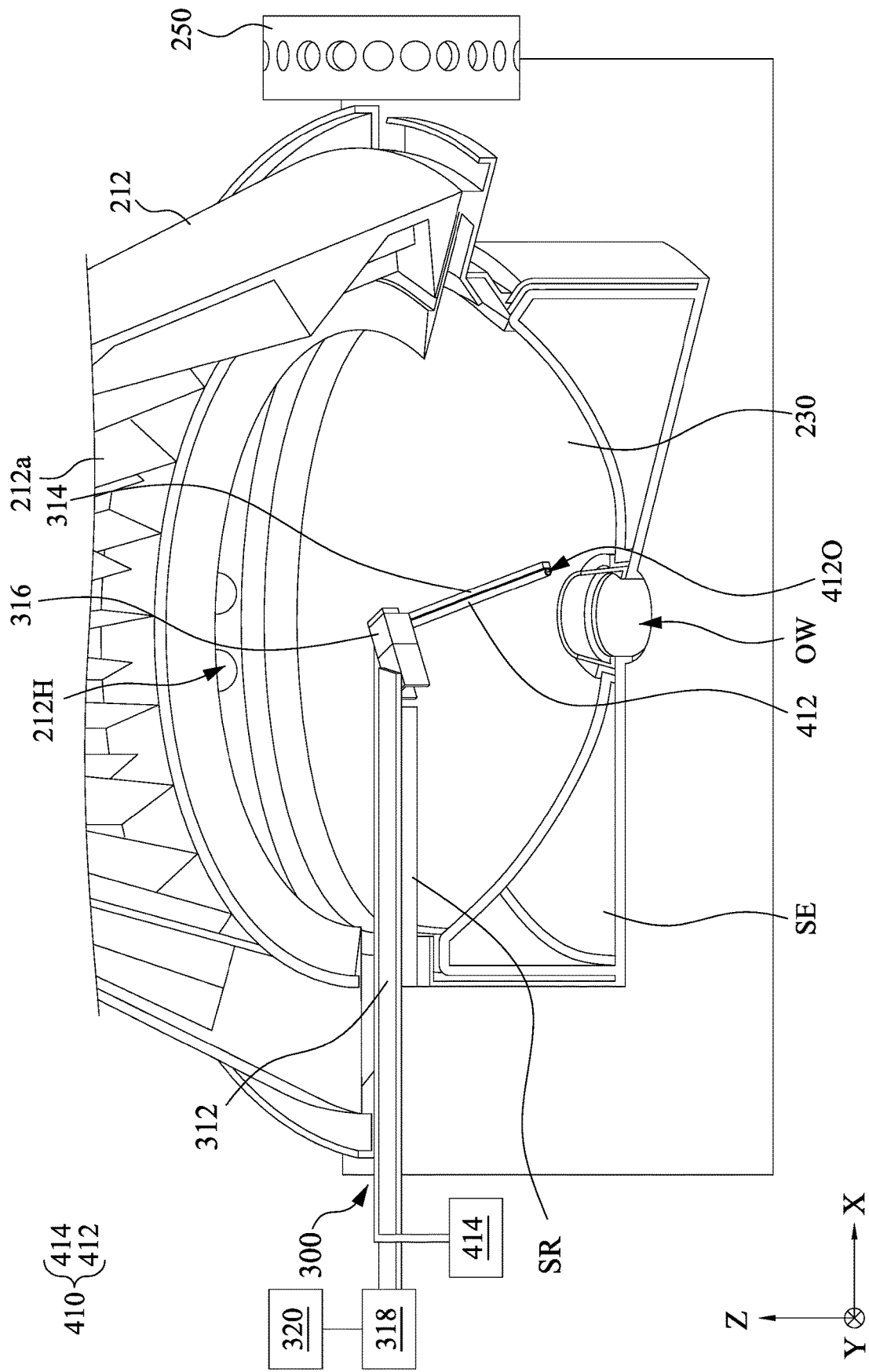
FIG. 10 is schematic view of a portion of an EUV radiation source and a robot arm according to some embodiments of the present disclosure.

FIG. 10 is a schematic view of a portion of an EUV radiation source 200 and a robot arm 300 according to some embodiments of the present disclosure. The present embodiments are similar to the embodiments of FIG. 5C, except that the detector 510 may be omitted. In the present embodiments, the step 120 in FIG. 1B may be omitted. Other details of the present embodiments are similar to those illustrated in FIG. 5C, and therefore not repeated herein.

Figure 11:
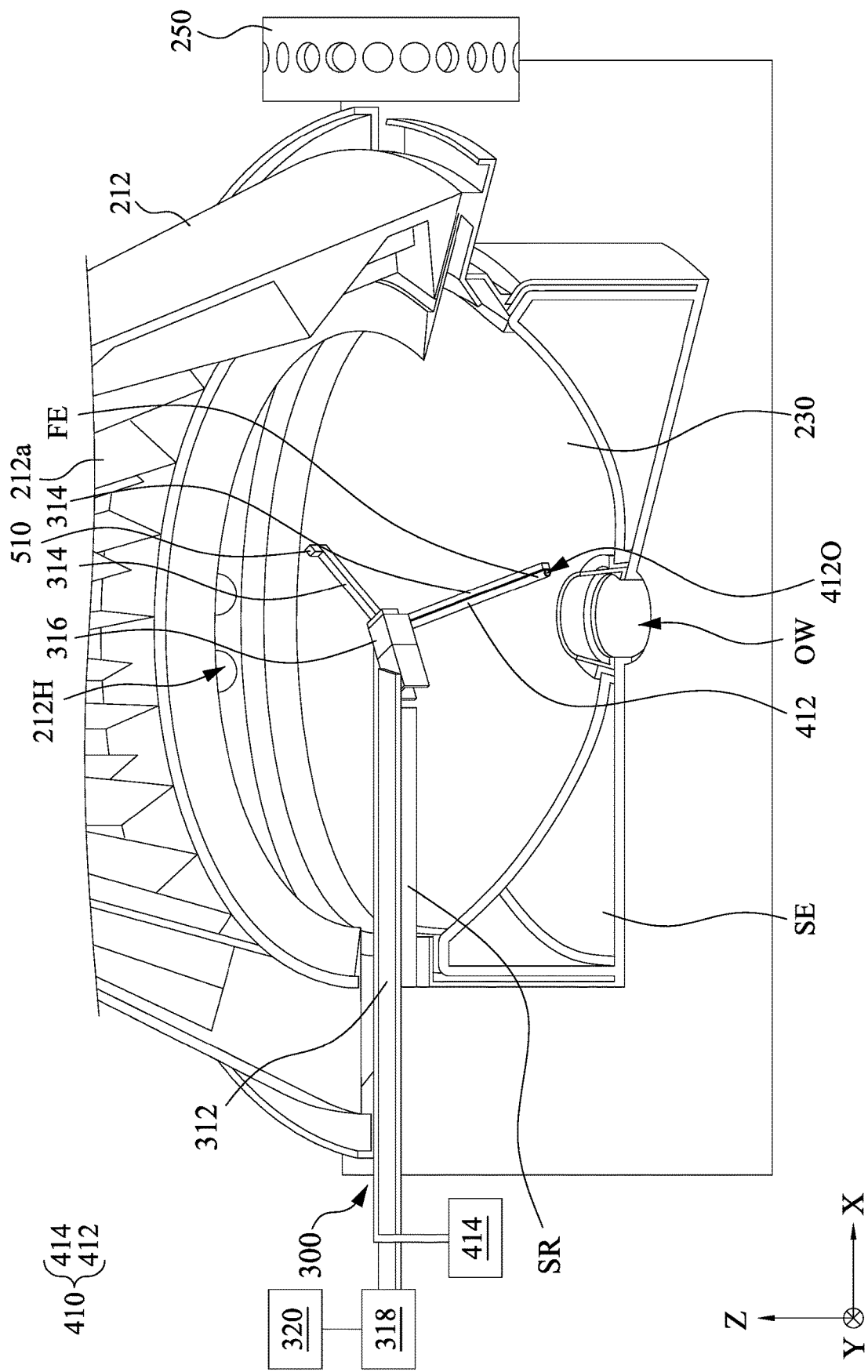
FIG. 11 is schematic view of a portion of an EUV radiation source and a robot arm according to some embodiments of the present disclosure.

FIG. 11 is a schematic view of a portion of an EUV radiation source 200 and a robot arm 300 according to some embodiments of the present disclosure. The present embodiments are similar to those of FIG. 5C, except that the extraction tube 412 and the detector 510 may be mounted on two different movable arm portions 314 of the robot arm 300. The two movable arm portions 314 of the robot arm 300 can be independently moved or rotated, such that the opening 412O of the extraction tube 412 can be moved to a first position to clean the collector 230, and the detector 510 can be moved to second position different from the first position to inspect the lower cone structure 260. Other details of the present embodiments are similar to those illustrated in FIG. 5C, and therefore not repeated herein.

Figure 12:
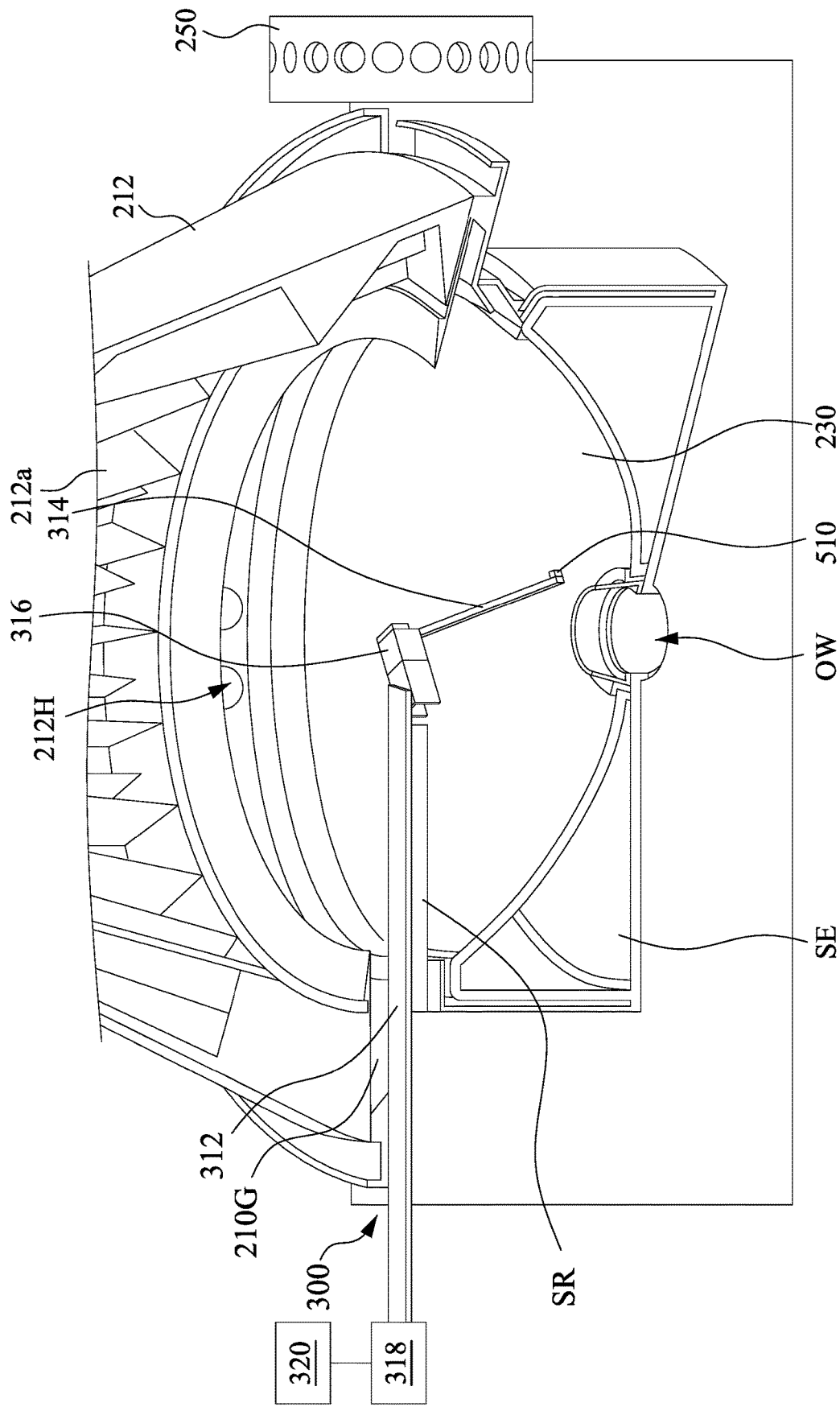
FIG. 12 is schematic view of a portion of an EUV radiation source and a robot arm according to some embodiments of the present disclosure.

FIG. 12 is a schematic view of a portion of an EUV radiation source 200 and a robot arm 300 according to some embodiments of the present disclosure. The present embodiments are similar to those of FIG. 5C, except that the cleaning device 410 (e.g., the extraction tube 412 and pump 414) may be omitted. In the present embodiments, the step 118 (i.e., the in-line cleaning process) in FIG. 1B may be omitted. Other details of the present embodiments are similar to those illustrated in FIG. 5C, and therefore not repeated herein.

Figure 13:
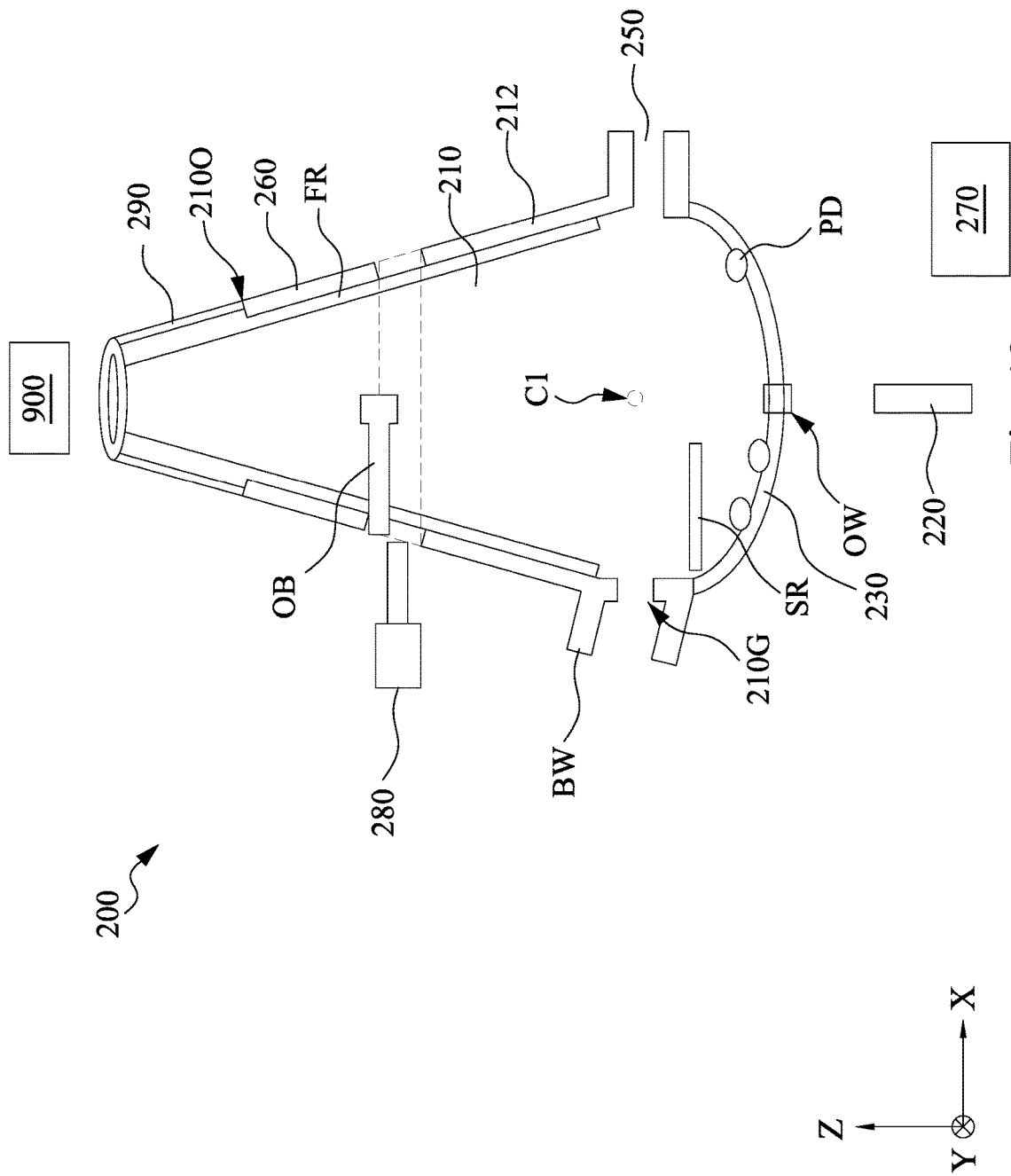
FIGS. 13-14 illustrates a method for using an EUV radiation source at different stages according to some embodiments of the present disclosure.
Figure 14:
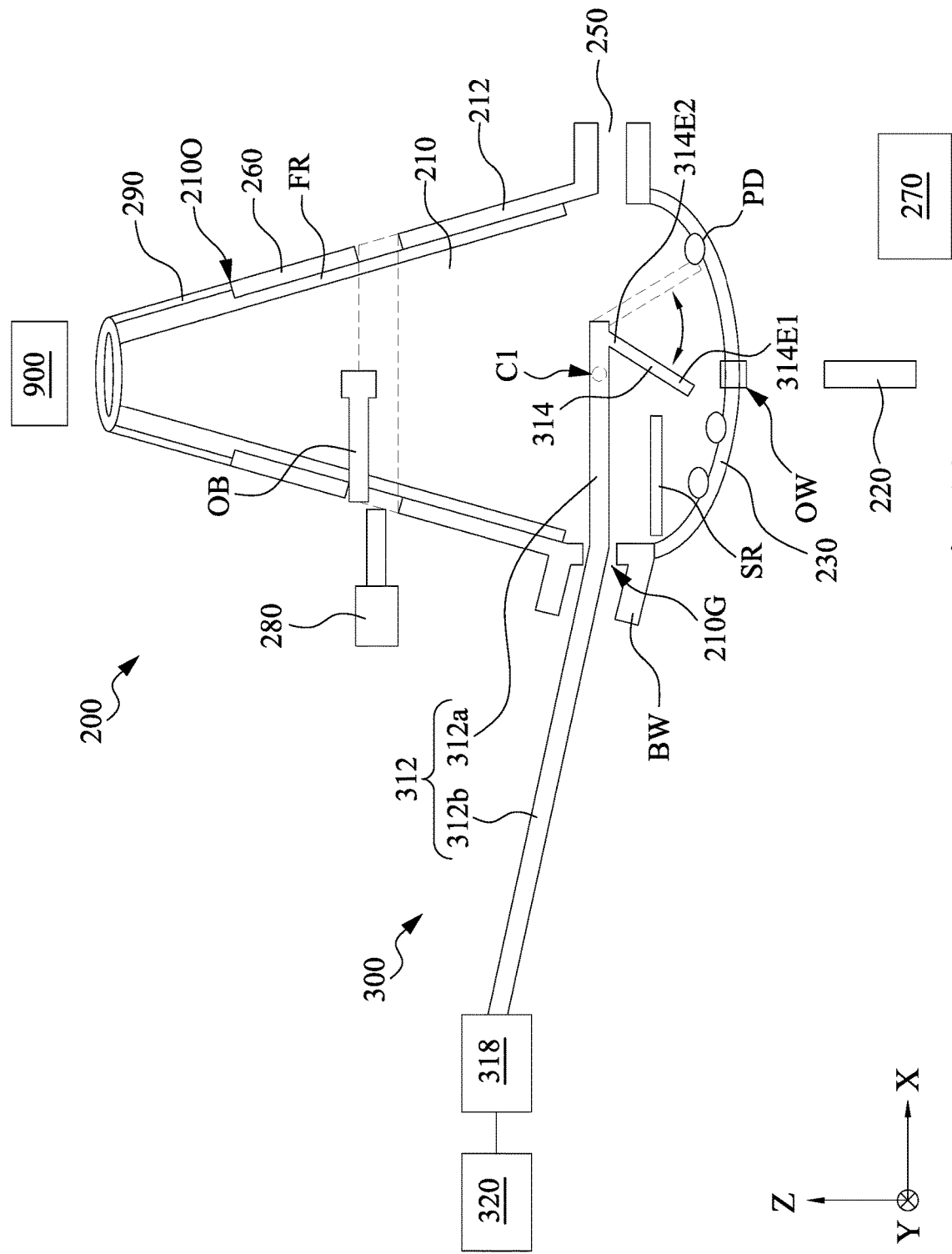

FIGS. 13-14 illustrates a method for using an EUV radiation source at different stages according to some embodiments of the present disclosure. The present embodiments are similar to the embodiments of FIGS. 2-7, except that in the present embodiments, the robot arm 300 is inserted into the port 210G when the bellow assembly BW is tuned to have a short length compared to the length of the bellow assembly BW that holds a droplet generator therein. In some embodiments, the bellow assembly BW is a flexible tube having a first end and a second end that can be moved relative to the first end to vary the length thereof. For example, the bellow assembly BW may have a motor to move the second end of the bellow assembly BW relative to the first end of the bellow assembly BW.

Referring to FIG. 13, after disassembling the droplet generator 240 from the port 210G of the vessel 210 (referring to FIG. 4), the bellow assembly BW is tuned to have a short length. For example, the bellow assembly BW is folded, thereby reducing a length thereof. In the present embodiments, the short length of the folded bellow assembly BW is less than the length of the bellow assembly BW that holds a droplet generator therein (as shown in FIG. 7).

Subsequently, referring to FIG. 14, the robot arm 300 is inserted into the port 210G through the folded bellow assembly BW. In the present embodiments, by folding the bellow assembly BW, the first arm segment 312a and the second arm segment 312b can be designed without fitting the configuration of the bellow assembly BW and the vessel 210. For example, a longitudinal direction of the first arm segment 312a may be parallel with or tilting with respect to a longitudinal direction of the second arm segment 312b. In some embodiments, the angle between the longitudinal directions of the first arm segment 312a and the second arm segment 312b can be fixed and not adjustable.

The robot arm 300 may be used in the in-line cleaning process or detecting the condition of the cone structure 260 as illustrated in the embodiments of FIGS. 2-7. After the in-line cleaning process and/or detecting the condition of the cone structure 260, the robot arm 300 is drawn out from the vessel 210, and then the bellow assembly BW may be tuned to have a long length (as the length in FIG. 6). For example, the bellow assembly BW is unfolded, thereby increasing a length thereof. A droplet generator (as shown in FIG. 7) may then be mounted onto the unfolded bellow assembly BW having the long length. Other details of the present embodiments are similar to those of the embodiments of FIGS. 2-7, and therefore not repeated herein.

FIG. 15 is a schematic view of robot arms used to move a droplet generator and move a cleaning device according to some embodiments of the present disclosure. In some embodiments, an exemplary robot arm 600 may be employed to automatedly move the droplet generator 240. For example, the robot arm 600 may be used to assembling the droplet generator 240 onto the vessel 210 (referring to FIGS. 2-7), or/and dissembling the droplet generator 240 from the vessel 210 (referring to FIGS. 2-7).

In some embodiments, the robot arm 600 includes a rotatable base 610, a rotatable arm 620, a rotatable forearm 630, a rotatable wrist member 640, a gripper 650 and a robot controller 660. Rotations of the base 610, the arm 620, the forearm 630 and the wrist member 640 are controlled by the robot controller 660 in such a way that the gripper 650 can be moved in a three-dimensional manner. For example, the base 610 is rotatable about an axis A1, the arm 620 is connected to the base 610 through a rotational joint or a pivotal joint in such a way that the arm 620 is rotatable about an axis A2 perpendicular to the axis A1. The forearm 630 is connected to the arm 620 through a rotational joint or a pivotal joint in such a way that the forearm 630 is rotatable about an axis A3 parallel with the axis A1. The wrist member 640 is connected to the forearm 630 through a rotational joint or a pivotal joint in such a way that the wrist member 640 is rotatable about an axis A4 perpendicular to the axes A1-A3. The gripper 650 is connected to an end of the wrist member 640 farthest from the forearm 630, so that the gripper 650 can be moved in a three-dimensional manner by using rotational motions performed by the base 610, the arm 620, the forearm 630 and the wrist member 640.

As a result, in the maintenance process, the gripper 650 can be moved to grip the droplet generator 240 and then disassemble the droplet generator 240 from the port 212G of the vessel 210 (referring to FIGS. 3A and 4). On the other hand, in the maintenance process, the gripper 650 gripping the droplet generator 240' can be moved back to the vessel 210 and then assemble the droplet generator 240' to the port 212G of the vessel 210 (referring to FIG. 7).

Although the embodiments depicted in FIG. 15 use the robot arm 600 to automatedly move the droplet generator 240 (and/or the droplet generator 240' in FIG. 7), in some other embodiments the droplet generator 240 (and/or the droplet generator 240' in FIG. 7) can be moved by one or more experienced human users, for example, technicians and/or engineers. In such embodiments, the experienced human user may manually hold and move the droplet generator 240 (and/or the droplet generator 240' in FIG. 7) after the droplet generator cools down.

In some embodiments, the robot controller 320 (referring to FIG. 5A) and the robot controller 660 are programmed to using the robot arm 600 to disassemble the droplet generator 240 from the vessel 210 (referring to FIGS. 3A and 4), inserting the robot arm 300 into the vessel 210 (referring to FIGS. 5A-5C), cleaning the collector 230 using the robot arm 300 (referring to FIGS. 5A-5C), withdrawing the robot arm 300 from the vessel 210 (referring to FIG. 6), and assembling the droplet generator 240' onto the vessel 210 (referring to FIG. 7) in sequence. For example, in some embodiments, the robot controller 320 (referring to FIGS. 5A-5C) may control the robot arm 300 to move the cleaning device 410 into the vessel 210 and clean the collector 230, in response to the droplet generator being moved away from the vessel 210 (referring to FIGS. 3A and 4) by the robot arm 600 under the control of the robot controller 660. In some embodiments, the robot arm 600 and the robot arm 300 are independently controlled. In other words, the robot arm 300 is free from control by the robot controller 660, and the robot arm 600 is free from control by the robot controller 320 (referring to FIG. 5A).

The robot controller 660 may be a part of an overall EUV radiation source 200, of which the robot arm 600 is a part. The robot controller 660 may include electronic memory and one or more electronic processors configured to execute programming instructions stored in the electronic memory, which may involve a program controlling the movement of the robot arm 300. In some embodiments, the robot controller 660 may include processors, central processing units (CPU), multi-processors, distributed processing systems, application specific integrated circuits (ASIC), or the like. In some embodiments, the robot controller 660, the robot controller 320 (referring to FIG. 5A), and the controller PC (referring to FIG. 4) are in a same processor. In some other embodiments, the robot controller 660, the robot controller 320 (referring to FIG. 5A), and the controller PC (referring to FIG. 4) are in different individual processors, respectively.

FIG. 16 is a schematic view of a lithography system 900 according to some embodiments of the present disclosure. The lithography system 900 may also be referred to as a scanner that is operable to perform lithography exposing processes with respective radiation source and exposure mode. In some embodiments, the lithography system 900 is an extreme ultraviolet (EUV) lithography system designed to expose a resist layer by EUV light EL. The resist layer is a material sensitive to the EUV light. In some embodiments, the EUV lithography system 900 employs the radiation source 200 to generate EUV light EL.

The lithography system 900 also employs an illuminator 910. In some embodiments, the illuminator 910 includes various reflective optics such as a single mirror or a mirror system having multiple mirrors in order to direct the EUV light EL from the radiation source 200 onto a mask stage 920, particularly to a mask 930 secured on the mask stage 920.

The lithography system 900 also includes the mask stage 920 configured to secure the mask 930. In some embodiments, the mask stage 920 includes an electrostatic chuck (e-chuck) used to secure the mask 930. In this context, the terms mask, photomask, and reticle are used interchangeably. In the present embodiments, the lithography system 900 is an EUV lithography system, and the mask 930 is a reflective mask. One exemplary structure of the mask 930 includes a substrate with a low thermal expansion material (LTEM). For example, the LTEM may include $TiO_2$ doped SiO2, or other suitable materials with low thermal expansion. The mask 930 includes a reflective multi-layer deposited on the substrate. The reflective multi-layer includes plural film pairs, such as molybdenum-silicon (Mo/Si) film pairs (e.g., a layer of molybdenum above or below a layer of silicon in each film pair). Alternatively, the reflective multi-layer may include molybdenum-beryllium (Mo/Be) film pairs, or other suitable materials that are configurable to highly reflect the EUV light EL. The mask 930 may further include a capping layer, such as ruthenium (Ru), disposed on the reflective multi-layer for protection. The mask 18 further includes an absorption layer, such as a tantalum boron nitride (TaBN) layer, deposited over the reflective multi-layer. The absorption layer is patterned to define a layer of an integrated circuit (IC). The mask 930 may have other structures or configurations in various embodiments.

The lithography system 900 also includes a projection optics module (or projection optics box (POB)) 940 for imaging the pattern of the mask 930 onto a semiconductor substrate W secured on a substrate stage (or wafer stage) 950 of the lithography system 900. The POB 940 includes reflective optics in the present embodiments. The light EL that is directed from the mask 930 and carries the image of the pattern defined on the mask 930 is collected by the POB 940. The illuminator 910 and the POB 940 may be collectively referred to as an optical module of the lithography system 900.

In the present embodiments, the semiconductor substrate W is a semiconductor wafer, such as a silicon wafer or other type of wafer to be patterned. The semiconductor substrate W is coated with a resist layer sensitive to the EUV light EL in the present embodiments. Various components including those described above are integrated together and are operable to perform lithography exposing processes.

In the present embodiments, the lithography system 900 further include plural light intensity sensors. For example, a light intensity sensor 962 is installed near the mask stage 920 and a light intensity sensor 964 is installed on the substrate stage 950. In some embodiments, an image sensor, such as a camera, may be installed on the substrate stage 950. In some embodiments, as illustrated previously, a controller (e.g., the controller PC) may be electrically connected with the light intensity sensors 962 and 964.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an in-line cleaning process is performed to clean the surface of the collector, thereby extending the lifetime of the collector. Another advantage is that the in-line cleaning process for cleaning the surface of the collector can be performed without moving the collector, thereby saving swap cost and gaining lots of tool time for productivity. Still another advantage is that a robot arm holding an image detector may be inserted into the EUV vessel, thereby detecting a condition of a cone structure at a top portion.

According to some embodiments of the present disclosure, a method for using an extreme ultraviolet radiation source is provided. The method includes performing a lithography process using an extreme ultraviolet (EUV) radiation source; after the lithography processes, inserting an extraction tube into a vessel of the EUV radiation source; and cleaning a collector of the EUV radiation source by using the extraction tube.

According to some embodiments of the present disclosure, a method includes performing a lithography process using an EUV radiation source; after the lithography processes, moving an image sensor into a vessel of the EUV radiation source; and detecting a tin contaminant on a cone structure at a top portion of the vessel by the image sensor.

According to some embodiments of the present disclosure, a method includes generating an EUV radiation in a vessel; directing, by using a collector at a bottom side of the vessel, the EUV radiation to an exit aperture of the vessel; measuring a light intensity of the EUV radiation; comparing the light intensity of the EUV radiation with a reference value; and according to a comparison result, providing a vacuuming suction force to a surface of the collector, wherein the collector is at the bottom side of the vessel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    performing a lithography process using an extreme ultraviolet (EUV) radiation source;
    after the lithography process, inserting an extraction tube into a vessel of the EUV radiation source; and
    cleaning a collector of the EUV radiation source by using the extraction tube.

2. The method of claim 1, wherein cleaning the collector of the EUV radiation source is performed when the collector is supported by a supporting structure below the vessel.

3. The method of claim 1, wherein cleaning the collector of the EUV radiation source by using the extraction tube comprises:
    causing the extraction tube to provide a vacuuming suction force to a surface of the collector.

4. The method of claim 1, further comprising:
    moving a front end of the extraction tube from a first position near a surface of the collector to a second position near the surface of the collector during cleaning the collector of the EUV radiation source.

5. The method of claim 1, further comprising:
    disassembling a droplet generator of the EUV radiation source from a port of the vessel of the EUV radiation source, wherein inserting the extraction tube into the vessel of the EUV radiation source is performed through the port of the vessel.

6. The method of claim 5, further comprising:
detecting a clogging condition of a nozzle in the droplet generator prior to disassembling the droplet generator from the port of the vessel of the EUV radiation source.

7. The method of claim 1, wherein inserting the extraction tube into the vessel of the EUV radiation source comprises:
inserting a robot arm into the vessel of the EUV radiation source, wherein the robot arm holds the extraction tube.

8. The method of claim 7, further comprising:
rotating a first portion of the robot arm with respect to a second portion of the robot arm during cleaning the collector of the EUV radiation source.

9. The method of claim 8, wherein a length of the second portion of the robot arm is greater than a radius of a top side of the collector.

10. A method, comprising:
performing a lithography process using an EUV radiation source;
after the lithography process, moving an image sensor into a vessel of the EUV radiation source; and
detecting a tin contaminant on a cone structure at a top portion of the vessel by the image sensor.

11. The method of claim 10, wherein moving the image sensor into the vessel of the EUV radiation source comprises:
inserting a robot arm into the vessel of the EUV radiation source, wherein the robot arm holds the image sensor.

12. The method of claim 11, further comprising:
rotating a first portion of the robot arm with respect to a second portion of the robot arm during detecting the tin contaminant on the cone structure by the image sensor.

13. The method of claim 11, further comprising:
moving a front end of the robot arm to a position between a plasma-formation point of the EUV radiation source and an exit aperture of the vessel of the EUV radiation source.

14. The method of claim 10, further comprising:
disassembling a droplet generator of the EUV radiation source from a port of the vessel of the EUV radiation source, wherein moving the image sensor into the vessel of the EUV radiation source is performed through the port of the vessel.

15. A method, comprising:
generating an EUV radiation in a vessel;
directing, by using a collector at a bottom side of the vessel, the EUV radiation to an exit aperture of the vessel;
measuring a light intensity of the EUV radiation;
comparing the light intensity of the EUV radiation with a reference value; and
according to a comparison result, providing a vacuuming suction force to a surface of the collector, wherein the collector is at the bottom side of the vessel.

16. The method of claim 15, further comprising:
disassembling a first droplet generator from a port of the vessel prior to providing the vacuuming suction force to the surface of the collector; and
assembling a second droplet generator onto the port of the vessel after providing the vacuuming suction force to the surface of the collector.

17. The method of claim 15, further comprising:
breaking a vacuum in the vessel prior to providing the vacuuming suction force to the surface of the collector.

18. The method of claim 15, wherein measuring the light intensity of the EUV radiation is performed using a light intensity sensor external to the vessel.

19. The method of claim 15, wherein measuring the light intensity of the EUV radiation is performed using a light intensity sensor on a substrate stage.

20. The method of claim 15, wherein measuring the light intensity of the EUV radiation is performed using a light intensity sensor near a mask stage.

* * * * *